(12) United States Patent
Xu et al.

(10) Patent No.: US 11,257,831 B2
(45) Date of Patent: Feb. 22, 2022

(54) THREE-DIMENSIONAL MEMORY DEVICES AND FABRICATING METHODS THEREOF

(71) Applicant: Yangtze Memory Technologies Co., Ltd., Hubei (CN)

(72) Inventors: Wenxiang Xu, Hubei (CN); Haohao Yang, Hubei (CN); Pan Huang, Hubei (CN); Ping Yan, Hubei (CN); Zongliang Huo, Hubei (CN); Wenbin Zhou, Hubei (CN); Wei Xu, Hubei (CN)

(73) Assignee: Yangtze Memory Technologies Co., Ltd., Hubei (CN)

(*) Notice: Subject to any disclaimer, the term of this patent is extended or adjusted under 35 U.S.C. 154(b) by 8 days.

(21) Appl. No.: 16/797,030

(22) Filed: Feb. 21, 2020

(65) Prior Publication Data
US 2021/0167076 A1    Jun. 3, 2021

Related U.S. Application Data

(63) Continuation of application No. PCT/CN2019/121451, filed on Nov. 28, 2019.

(51) Int. Cl.
*H01L 27/11519*   (2017.01)
*H01L 27/11539*   (2017.01)
(Continued)

(52) U.S. Cl.
CPC .... *H01L 27/11539* (2013.01); *H01L 23/5226* (2013.01); *H01L 27/11519* (2013.01);
(Continued)

(58) Field of Classification Search
CPC .......... H01L 23/5226; H01L 27/11519; H01L 27/11556; H01L 27/11565; H01L 27/11582
See application file for complete search history.

(56) References Cited

U.S. PATENT DOCUMENTS 9,397,043 B1   7/2016   Minemura
10,600,805 B2   3/2020   Park et al.
(Continued)

FOREIGN PATENT DOCUMENTS

| CN | 109155313 A | 1/2019 |
| CN | 110197830 A | 9/2019 |
| CN | 110277396 A | 9/2019 |

*Primary Examiner* — Sarah K Salerno
(74) *Attorney, Agent, or Firm* — Sterne, Kessler, Goldstein & Fox P.L.L.C.

(57) ABSTRACT

Embodiments of three-dimensional (3D) memory devices and fabricating methods thereof are disclosed. The method includes: forming an alternating dielectric stack on a substrate; forming a top selective gate cut and two structure strengthen plugs in an upper portion of the alternating dielectric stack, wherein each structure strengthen plug has a narrow support body and two enlarged connecting portions; forming a plurality of channel structures in the alternating dielectric stack; forming a plurality of gate line silts in the alternating dielectric stack, wherein each gate line slit exposes a sidewall of one enlarged connecting portion of a corresponding structure strengthen plug; transforming the alternating dielectric stack into an alternating conductive/dielectric stack; and forming a gate line slit structure in each gate line slit including an enlarged end portion connected to one enlarged connecting portion of a corresponding structure strengthen plug.

20 Claims, 18 Drawing Sheets

(51) Int. Cl.
   *H01L 23/522*     (2006.01)
   *H01L 27/11556*   (2017.01)
   *H01L 27/11565*   (2017.01)
   *H01L 27/11582*   (2017.01)

(52) U.S. Cl.
   CPC .. *H01L 27/11556* (2013.01); *H01L 27/11565* (2013.01); *H01L 27/11582* (2013.01)

(56) References Cited

U.S. PATENT DOCUMENTS

2014/0138765 A1   5/2014   Lee et al.
2017/0256562 A1   9/2017   Sonoda et al.
2020/0058674 A1   2/2020   Jiang et al.

THREE-DIMENSIONAL MEMORY DEVICES AND FABRICATING METHODS THEREOF

CROSS-REFERENCE TO RELATED APPLICATIONS

This application claims priority to PCT Application No. PCT/CN2019/121451, filed on Nov. 28, 2019, which is incorporated herein by reference in its entirety.

TECHNICAL FIELD

The present disclosure generally relates to the field of semiconductor technology, and more particularly, to a method for forming a three-dimensional (3D) memory device.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

As semiconductor technology advances, 3D memory devices, such as 3D NAND memory devices, keep scaling more oxide/nitride (ON) layers to improve the area utilization of wafers. In some existing 3D NAND memory devices, as the number of oxide/nitride (ON) layers increases, an etch depth of gate line slit (GLS) increases accordingly, resulting a risk of collapse of the word line (WL) structure between GLSs in the subsequent process due to stress and other factors. Such WL structure collapsion can affect subsequent 3D memory device fabricating processes, such as increasing overlay error in the lithographic alignment process.

BRIEF SUMMARY

Embodiments of three-dimensional (3D) memory devices and fabricating methods thereof are disclosed herein.

One aspect of the present disclosure provides a method for forming a three-dimensional (3D) memory device. The method can comprise: forming an alternating dielectric stack on a substrate; forming a top selective gate cut and two structure strengthen plugs in an upper portion of the alternating dielectric stack, wherein each structure strengthen plug has a narrow support body and two enlarged connecting portions; forming a plurality of channel structures in the alternating dielectric stack; forming a plurality of gate line silts in the alternating dielectric stack, wherein each gate line slit exposes a sidewall of one enlarged connecting portion of a corresponding structure strengthen plug; transforming the alternating dielectric stack into an alternating conductive/dielectric stack; and forming a gate line slit structure in each gate line slit including an enlarged end portion connected to one enlarged connecting portion of a corresponding structure strengthen plug.

In some embodiments, forming the alternating dielectric stack comprises: forming at least 32 dielectric layer pairs stacked in a vertical direction, wherein each dielectric layer pair includes a first dielectric layer and a second dielectric layer that is different from the first dielectric layer.

In some embodiments, the top selective gate cut and the structure strengthen plug are simultaneously formed in a single process.

In some embodiments, forming the top selective gate cut and the two structure strengthen plugs comprises: forming a trench in an upper portion of the alternating dielectric stack and extending along a word line direction, and forming two openings on both side of the trench; and depositing an insulating material in the trench and the two openings to form the top selective gate cut and the two structure strengthen plugs respectively.

In some embodiments, forming the trench and the two openings comprises:
etching top three dielectric layer pairs of the alternating dielectric stack to form the trench and the two openings; wherein the two openings have a same distance from the trench along a bit line direction.

In some embodiments, forming the opening comprises: using an H-like-shape patterned mask to form the opening having a less width in the bit line direction in the middle and a larger width in the bit line direction at two ends along the word line direction.

In some embodiments, forming the plurality of channel structures comprises: forming a plurality of channel holes penetrating the alternating dielectric layer; forming a functional layer on sidewalls of the plurality of channel holes; forming a channel layer covering the functional layer in each channel hole; and forming a dielectric filling structure filling each channel hole.

In some embodiments, forming the plurality of channel holes comprises: forming a same number of rows of channel holes between adjacent top selective gate cut and structure strengthen plug.

In some embodiments, forming the plurality of channel holes comprises: forming an even number of rows of channel holes between adjacent top selective gate cut and structure strengthen plug; wherein each row of channel holes are arranged staggered with adjacent row of channel holes.

In some embodiments, forming the plurality of gate line silts comprises: forming a pair of gate line slits on both sides of each structure strengthen plug, penetrating the alternating dielectric stack, and extending along the word line direction.

In some embodiments, transforming the alternating dielectric stack into the alternating conductive/dielectric stack comprises: replacing the second dielectric layers in the alternating dielectric with conductive layers.

The method of claim 1, wherein forming the gate line slit structure in each gate line slit comprises: forming a gate line slit glue layer on sidewalls of each gate line slit; forming a lower conductive wall in a lower portion of each gate line slit; forming an upper conductive wall in an upper portion of each gate line slit.

In some embodiments, forming the gate line slit structure in each gate line slit further comprises: forming another gate line slit glue layer between the lower conductive wall and the upper conductive wall; wherein the lower conductive wall has a less stress to the 3D memory device compared to the upper conductive wall.

Another aspect of the present disclosure provides a three-dimensional (3D) memory device, comprising: an alternating conductive/dielectric stack on a substrate; a plurality of channel structures in the alternating conductive/dielectric stack; a top selective gate cut between the plurality of channel structures and extending in a word line direction; two structure strengthen plugs between the plurality of channel structures, each having a narrow support body and two enlarged connecting portions; a plurality of gate line slit structures in the alternating conductive/dielectric stack, wherein each gate line slit structure includes an enlarged end portion connected to one enlarged connecting portion of a corresponding structure strengthen plug.

In some embodiments, the alternating conductive/dielectric stack comprises at least 32 conductive/dielectric layer pairs stacked in a vertical direction.

In some embodiments, the top selective gate cut and the two structure strengthen plugs comprise a same material and are located in a same upper portion of the alternating conductive/dielectric stack; and the two structure strengthen plugs have a same distance from the top selective gate cut along a bit line direction.

In some embodiments, each structure strengthen plug has a narrow support body with a less width in the bit line direction and two enlarged connecting portions with a larger width in the bit line direction arranged at two ends in the word line direction.

In some embodiments, each channel structures comprises: a functional layer on a sidewall of a channel hole; a dielectric filling structure filling each channel hole; and a channel layer between the functional layer and the dielectric filling.

In some embodiments, a same even number of rows of channel structures are arranged between adjacent top selective gate cut and structure strengthen plug; and each row of channel structures are arranged staggered with adjacent row of channel structures.

In some embodiments, each gate line slit structure penetrates the alternating conductive/dielectric stack, and extends along the word line direction, and comprises a lower conductive wall, an upper conductive wall, and a gate line slit glue layer between the lower conductive wall and the upper conductive wall.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
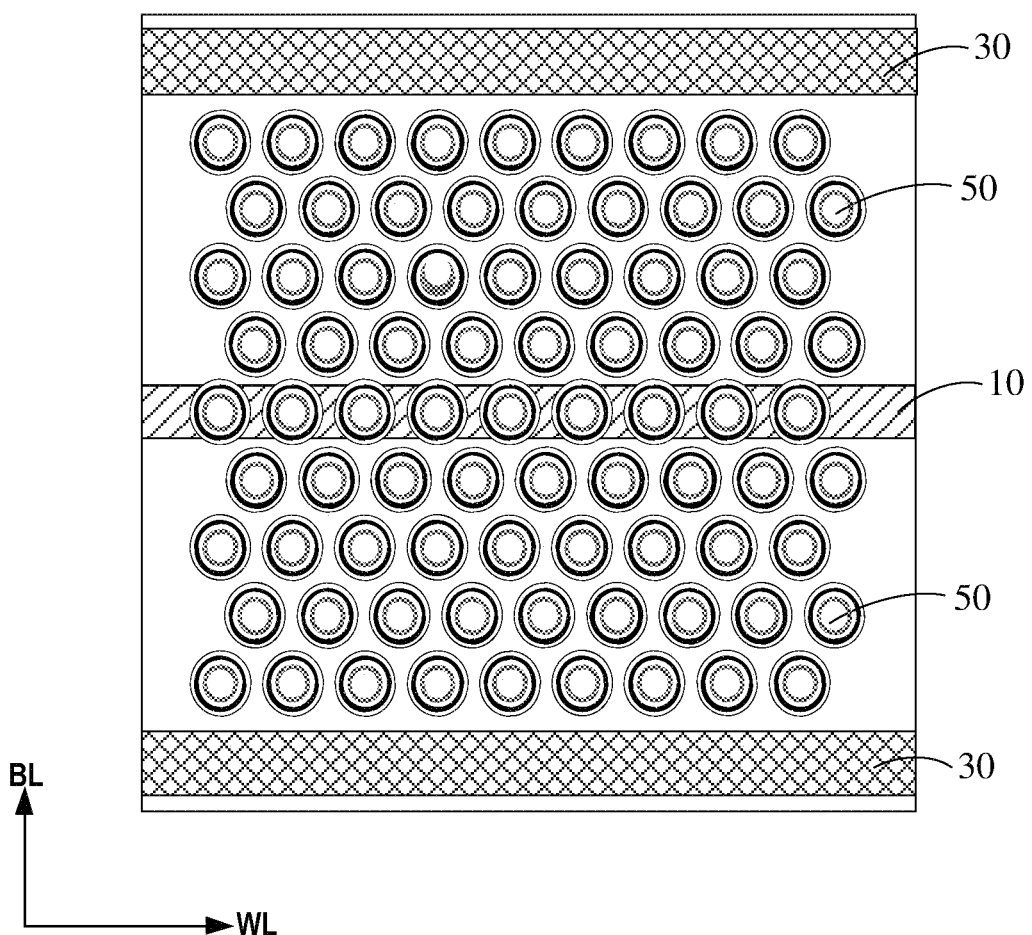
FIG. 1 illustrates a schematic diagram of a 3D memory device in a top view

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context.

For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of an Homogeneous or inhomogeneous continuous structure that has a thickness less than the thickness of the continuous structure. For example, a layer can be located between any pair of lateral planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Various embodiments in accordance with the present disclosure provide a method for forming a 3D memory device with a novel design for strengthen a structure of Gate Line Slit (GLS) structure for a memory array (also referred to herein as an "array device").

Referring to FIG. 1, a schematic diagram of a 3D memory device is shown in a top view. As shown, in some existing 3D NAND memory devices, multiple slits can be laterally extended in parallel along a word line (WL) direction. A Gate Line Slit (GLS) structure 30 can be formed in each slit to divide the memory array into multiple memory fingers.

Each memory finger can include multiple (e.g., nine) rows of channel structures 50 arranged in a staggered manner between two adjacent GLS structures 30. A top selective gate (TSG) cut 10 is located in the middle of the memory finger to separate the memory finger into two equal parts. Due to the size limitation and fabricating process sequence, the top selective gate cut 10 is formed after forming the multiple rows of channel structures 50, and occupies the locations of the middle row (e.g., fifth row) of the multiple (e.g., nine) rows of channel structures 50.

As discussed in the background section, as 3D memory devices keep scaling more number of oxide/nitride (ON) layers to improve the area utilization of wafers, the etch depth of GLS increases accordingly, resulting a risk of collapsion of the word line (WL) structure between adjacent GLS structures 30 in the subsequent process due to stress and other factors. Such WL structure collapse can affect subsequent 3D memory device fabricating processes, such as increasing overlay error in the lithographic alignment process.

Figure 2:
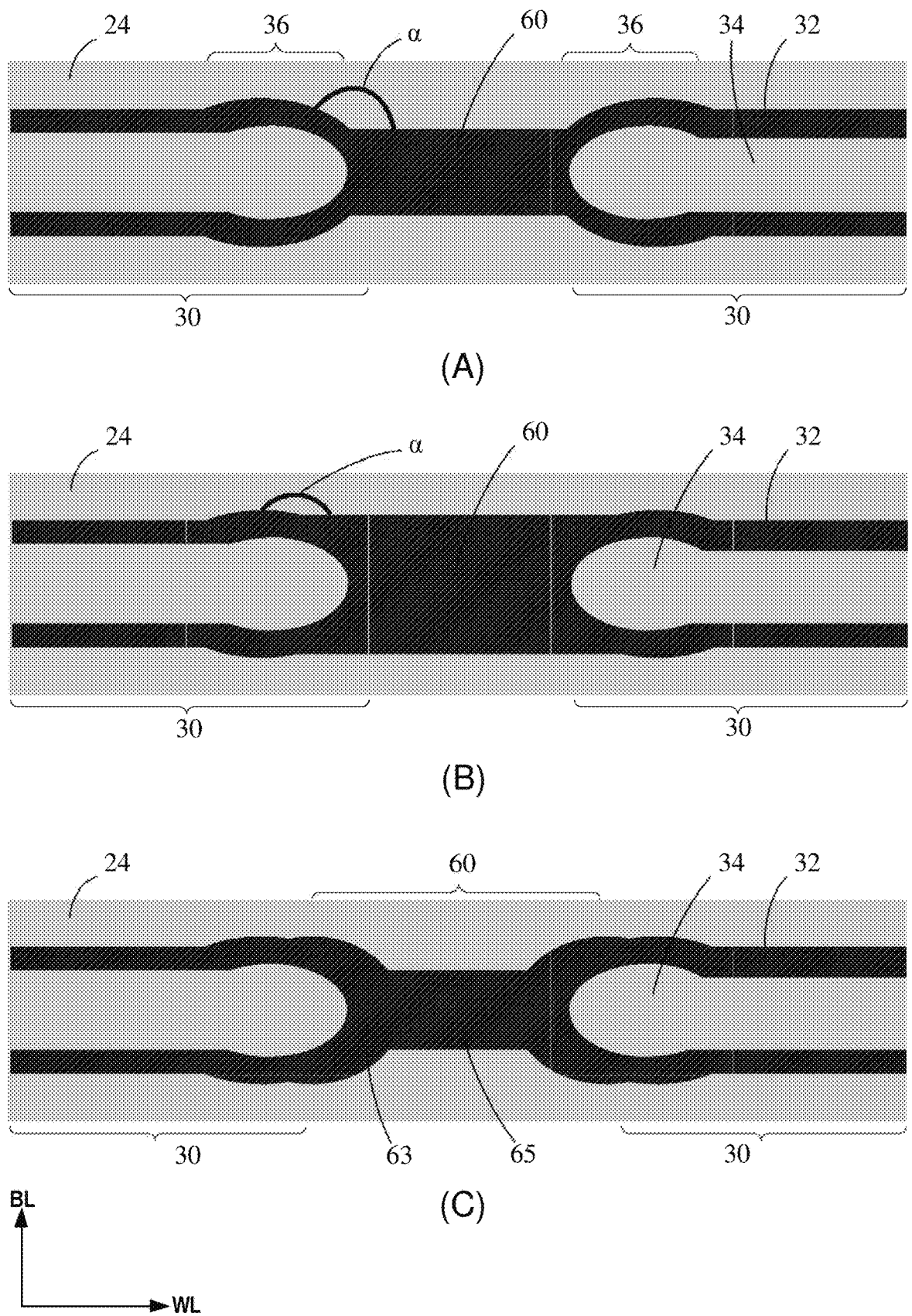
FIG. 2 illustrate various designs of vertically fixed GLS structure in a schematic enlarged top view.

Vertically fixed GLS structure is a technical solution to avoid the WL structure collapse. Referring to FIG. 2, various designs of vertically fixed GLS structure are shown in a schematic enlarged top view. A GLS structure 30 including a conductive wall 34 sandwiched by an insulating coating 32 is cut off to form a gap in the core area. Each section of the GLS structure 30 can include an enlarged end portion 36 adjacent to the gap. A structure strengthen plug 60 can be formed in the gap of the GLS structure 30. The structure strengthen plug 60 can include a silicon oxide material and be connected to the two enlarged end portions 36 of the GLS structures 30.

As shown FIG. 2 (A), the structure strengthen plug 60 can have a rectangle shape. In such design, a contact angle a between the structure strengthen plug 60 and the enlarged end portion 36 of the GLS structure 30 is relatively small, and a thickness of the silicon oxide layer between the conductive wall 34 of the enlarged end portion 36 of the GLS structure 30 and the word line (WL) 24 is relatively thin. In the subsequent gate replacement process including silicon nitride (SiN) removing process and conductive material (e.g., tungsten) filling process, due to the tip discharge or the void of silicon oxide later and other factors, a short between the conductive wall 34 in the enlarged end portion 36 and the WL 24 can cause a breakdown fail of the 3D memory device.

As shown FIG. 2 (B), in order to increase the thickness of the silicon oxide layer between the conductive wall 34 in the enlarged end portion 36 and the WL 24, a width of the structure strengthen plug 60 in the bit line (BL) direction can be increased. In such a design, a risk of the short between the conductive wall 34 in the enlarged end portion 36 and the WL 24 can be reduced by increasing the contact angle a and the thickness of the silicon oxide layer between the conductive wall 34 in the enlarged end portion 36 and the WL 24. However, since the structure strengthen plug 60 is formed by an atomic layer deposition (ALD), which is costly. Thus, an area enlarged structure strengthen plug 60 may cause an increased manufacturing cost of the 3D memory device.

As shown FIG. 2 (C), in some embodiments, the structure strengthen plug 60 can include a narrow support body 65 having a relatively less width in the BL direction and two enlarged connecting portions 63 having a relatively larger width in the BL direction. The two enlarged connecting portions 63 of the structure strengthen plug 60 can be connected with the two enlarged end portions 36 of the GLS structure 30 respectively along the WL direction. That is, the structure strengthen plug 60 can have an H-like-shape in such design to not only increase the thickness of the silicon oxide layer between the conductive wall 34 in the enlarged end portion 36 and the WL 24, but also keep the area of the structure strengthen plug 60 limited. As such, under the premise of ensuring a sufficient thickness of the silicon oxide layer between the conductive wall 34 in the enlarged end portion 36 and the WL 24 to reduce the risk of electrical leakage, the area of the structure strengthen plug 60 can be effectively reduced, thereby reducing the amount of silicon oxide in the ALD deposition to effectively reduce the cost.

Figure 3:
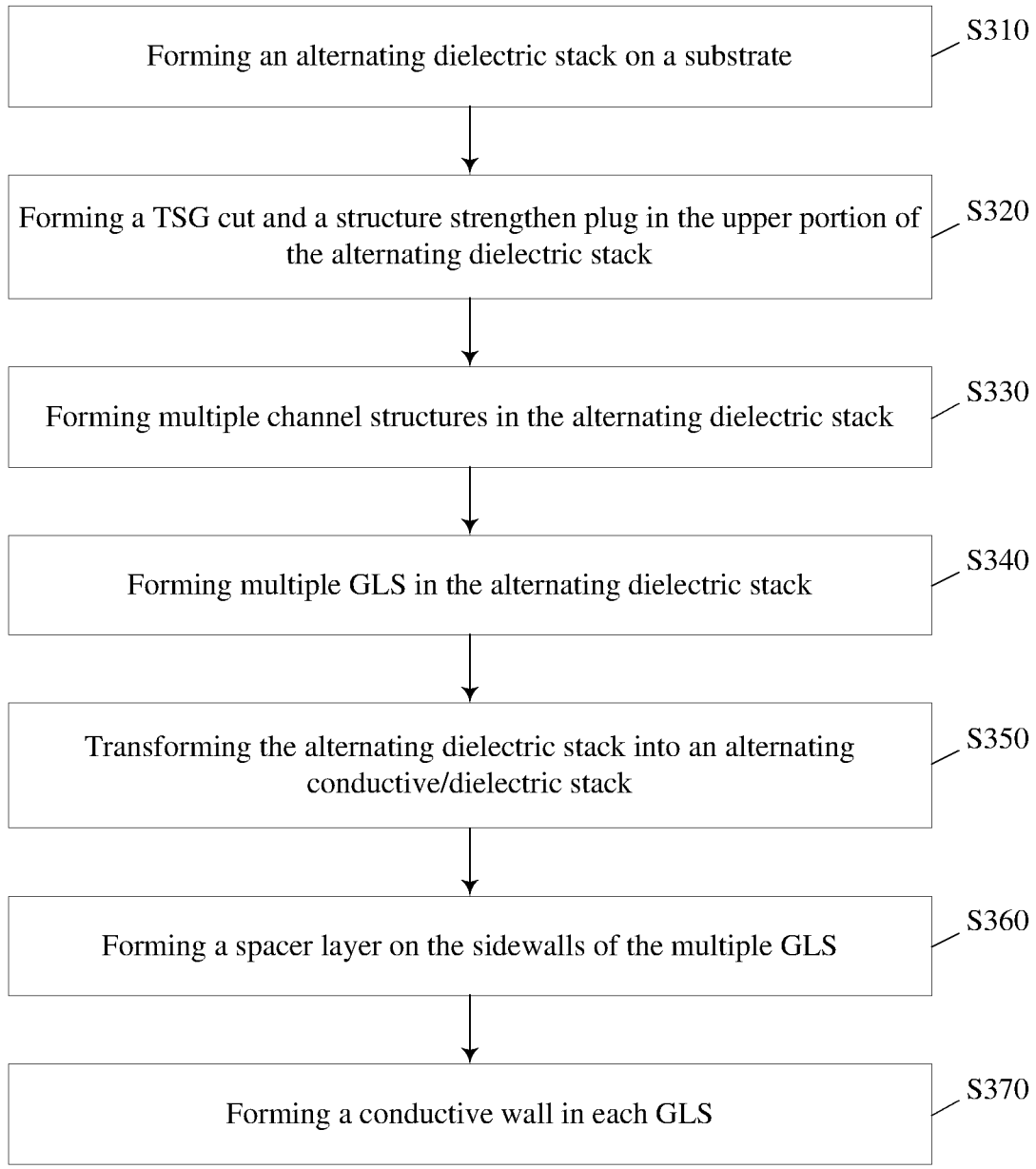
FIG. 3 illustrates a flow diagram of an exemplary method for forming a 3D memory device in accordance with some embodiments of the present disclosure.

Referring to FIG. 3, a flow diagram of an exemplary method for forming a 3D memory device is shown in accordance with some embodiments of the present disclosure. FIGS. 4, 5A-5C, 6A-6B, 7A-7B, 8A-8B, 9A-9B and 10A-10C illustrate schematics of an exemplary 3D memory device at certain fabricating stages of the method shown in FIG. 2 in various views according to some embodiments of the present disclosure.

Figure 4:
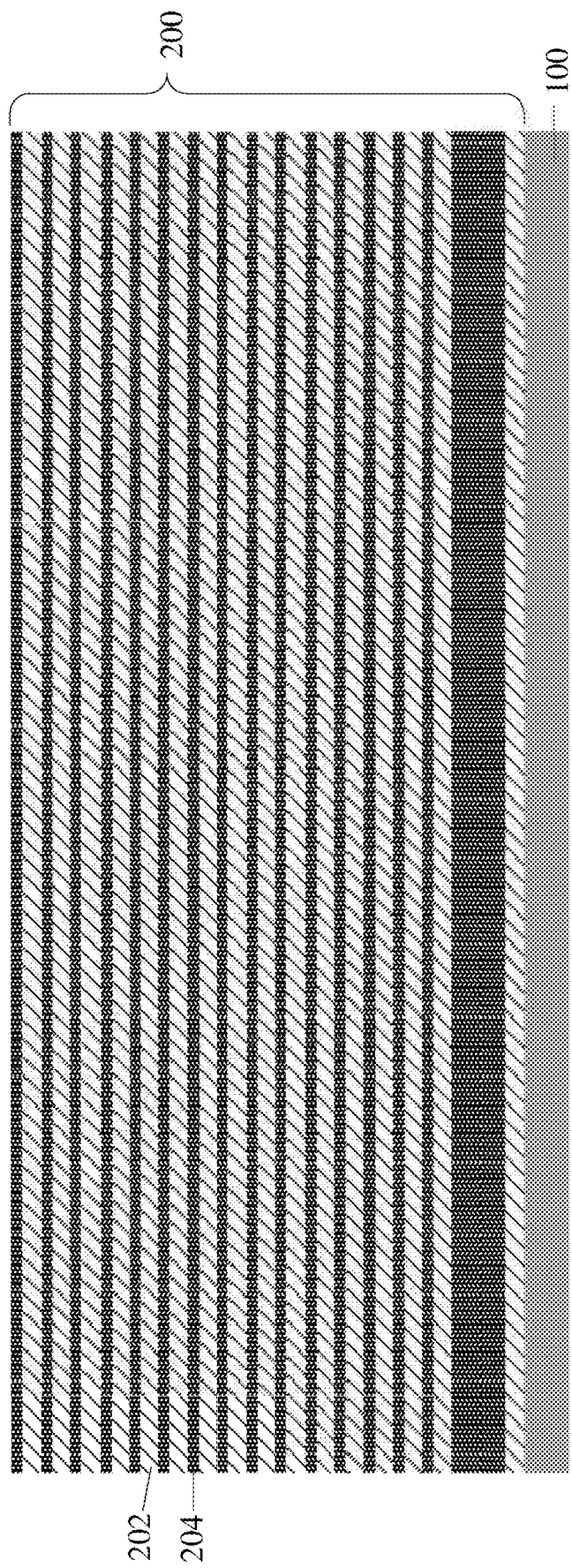
FIGS. 4, 5A-5C, 6A-6B, 7A-7B, 8A-8B, 9A-9B and 10A-10C illustrate schematics of an exemplary 3D memory device at certain fabricating stages of the method shown in FIG. 3 in various views according to some embodiments of the present disclosure.

As shown in FIG. 3, the method can start at operation S310, in which an alternating dielectric stack can be formed on a substrate. FIG. 4 illustrates a cross-sectional view of the 3D structure after operation S310.

In some embodiments, the substrate 100 can be any suitable semiconductor substrate having any suitable structure, such as a monocrystalline single-layer substrate, a polycrystalline silicon (polysilicon) single-layer substrate, a polysilicon and metal multi-layer substrate, etc.

The alternating dielectric stack 200 including a plurality of dielectric layer pairs can be formed on the substrate 100. The alternating dielectric stack 200 can include an alternating stack of a first dielectric layer 202 (e.g., silicon oxide) and a second dielectric layer 204 (e.g., silicon nitride) that is different from first dielectric layer, for example. The plurality of first dielectric layers 202 and second dielectric layers 204 are extended in a lateral direction that is parallel to the surface of the substrate 100. In some embodiments, there are more layers than the dielectric layer pairs made of different materials and with different thicknesses in the alternating dielectric stack 200. The alternating dielectric stack 200 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, the alternating dielectric stack 200 can include a plurality of Silicon oxide/nitride layer pairs. Each dielectric layer pair includes a layer of silicon oxide 202 and a layer of silicon nitride 204. The plurality of oxide/nitride layer pairs are also referred to herein as an "alternating oxide/nitride stack." That is, in the alternating dielectric stack 200, multiple oxide layers 202 (shown in the areas with solid gray) and multiple nitride layers 204 (shown in the areas with meshes) alternate in a vertical direction. In other words, except a top and a bottom layer of a given alternating oxide/nitride stack, each of the other oxide layers 202 can be sandwiched by two adjacent nitride layers 204, and each of the nitride layers 204 can be sandwiched by two adjacent oxide layers 202.

Oxide layers can each have the same thickness or have different thicknesses. For example, a thickness of each oxide layer can be in a range from 10 nm to 100 nm, preferably about 25 nm. Similarly, nitride layers can each have the same thickness or have different thicknesses. For example, a thickness of each nitride layer can be in a range from 10 nm to 100 nm, preferably about 35 nm.

It is noted that, in the present disclosure, the oxide layers 202 and/or nitride layers 204 can include any suitable oxide materials and/or nitride materials. For example, the oxide materials can include silicides, and the element of nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The alternating dielectric stack 200 can include any suitable number of layers of the oxide layers 202 and the nitride layers 204. In some embodiments, a total number of layers of the oxide layers 202 and the nitride layers 204 in the alternating dielectric stack 200 is equal to or larger than 64. That is, a number of oxide/nitride layer pairs can be equal to or larger than 32. In some embodiments, the alternating oxide/nitride stack 200 includes more oxide layers or more nitride layers with different materials and/or thicknesses than the oxide/nitride layer pair.

Figure 5A:
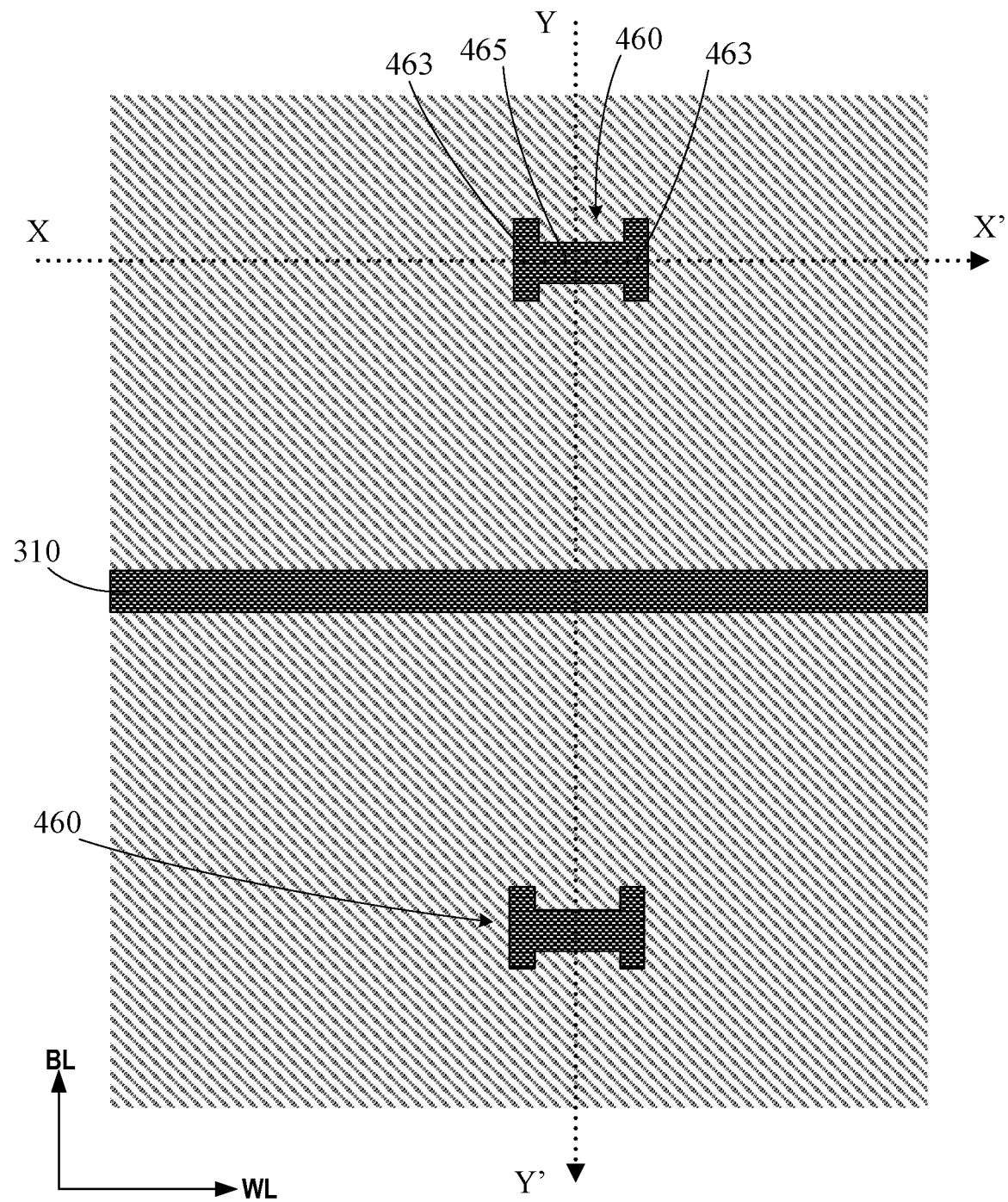
Figure 5B:
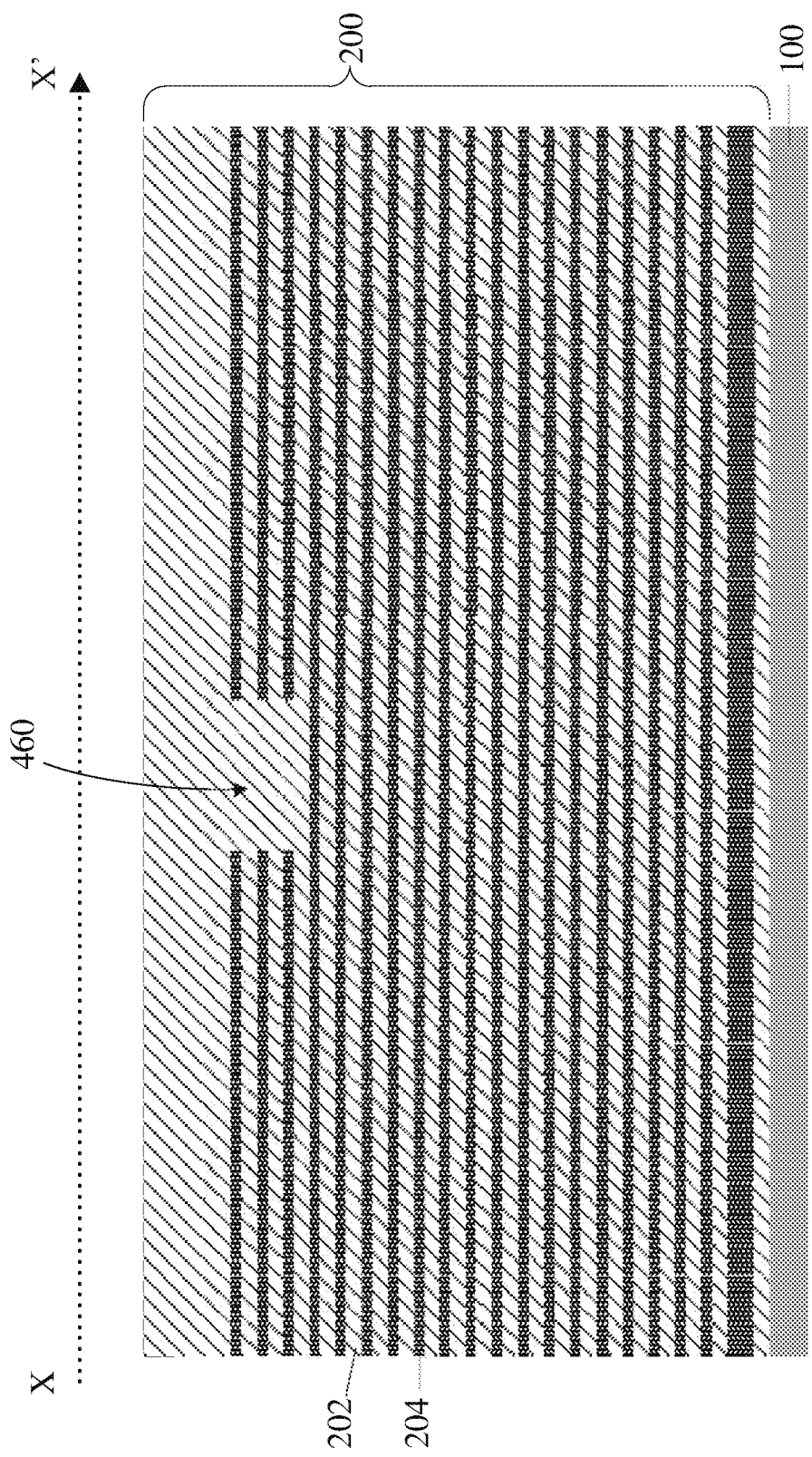
Figure 5C:
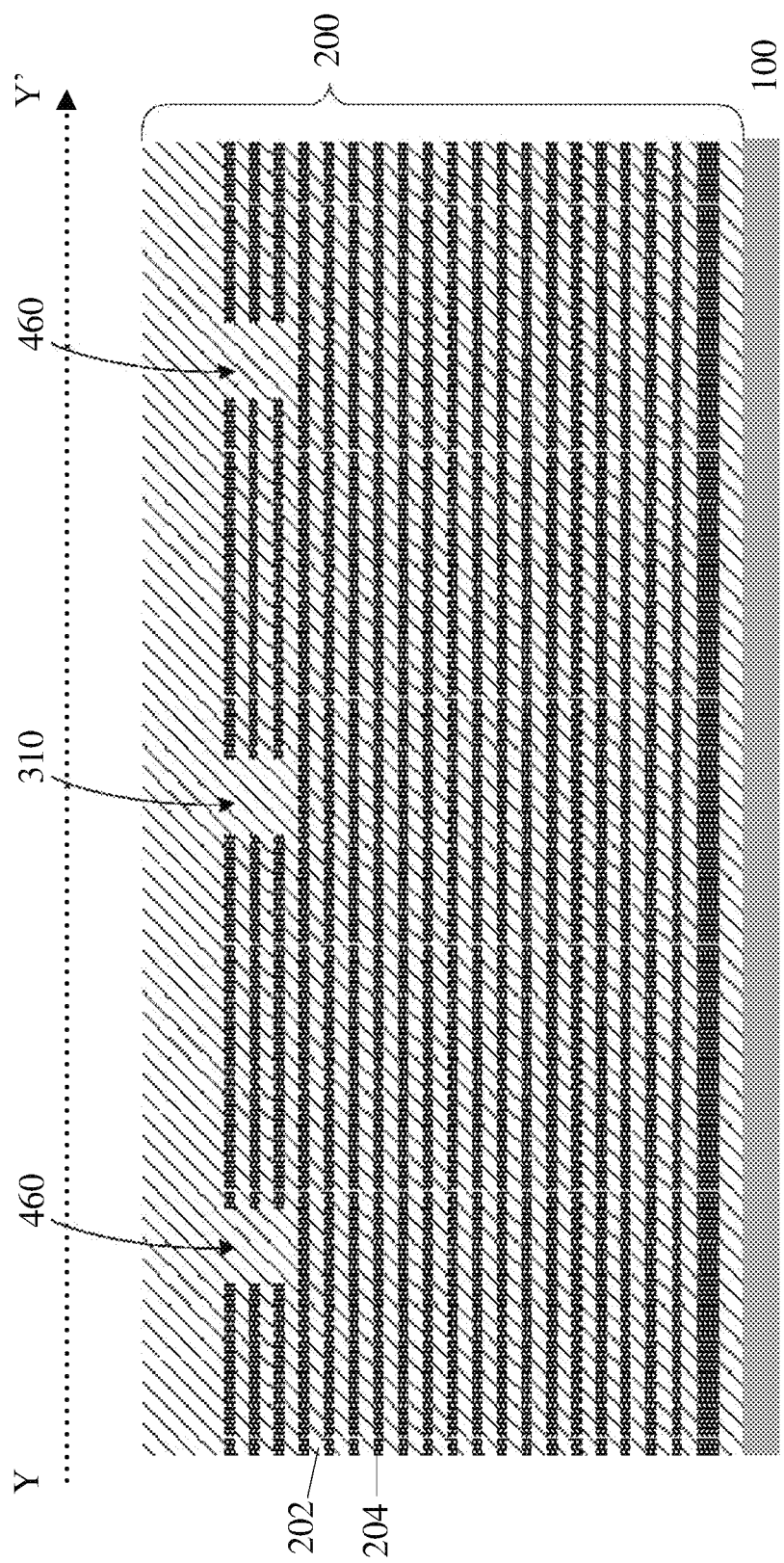

Referring back to FIG. 3, the method proceeds to operation S320, in which a top selective gate (TSG) cut can be formed in an upper portion of the alternating dielectric stack and extending along the WL direction, and a structure strengthen plug can be formed on each side of the TSG cut in the upper portion of the alternating dielectric stack. FIG. 5A illustrates a top view of the 3D structure after operation S320. FIG. 5B illustrates a cross-sectional view along the XX' direction of the 3D structure after operation S320. FIG. 5C illustrates a cross-sectional view along the YY' direction of the 3D structure after operation S320.

As shown in FIG. 5A, the TSG cut 310 can extend horizontally along the WL direction. Two structure strengthen plugs 460 are located on both sides of the TSG cut 310 along the BL direction. The two structure strengthen plugs 460 have a same distance from the TSG cut 310. As described above in connection with FIG. 2 (C), each structure strengthen plug 460 can include a narrow support body 465 having a relatively less width in the BL direction and two enlarged connecting portions 463 having a relatively larger width in the BL direction.

In some embodiments, the TSG cut 310 and the two structure strengthen plugs 460 can be formed in a same patterning process. For example, a mask layer (e.g., photoresist layer, not shown) can be form on the alternating dielectric stack 200. The mask can be patterned by using, e.g., photolithography, to form openings corresponding to the TSG cut 310 and the two structure strengthen plugs 460 in the patterned mask layer. It is noted that, the patterned mask layer has openings of same shape corresponding to the structure strengthen plugs 460. That is, each opening corresponding to the structure strengthen plug 460 has an H-like-shape.

A suitable etching process, e.g., dry etch and/or wet etch, can be performed to remove portions of the alternating dielectric stack 200 exposed by the openings to form trenches. In some embodiments, the trenches can extend and penetrate top three oxide/nitride layer pairs of the alternating dielectric stack 200. The mask layer can be removed after the formation of the trenches. A deposition process can then be performed to filled the trenches with any suitable filling material (e.g., silicon oxide) to form the TSG cut 310 and the two structure strengthen plugs 460, as shown in FIGS. 5B and 5C. It is noted that, in some embodiments, the filling material may also be coated on the top surface of the alternating dielectric stack 200 during the depositing process for forming the TSG cut 310 and the two structure strengthen plugs 460 in the trenches.

Figure 6A:
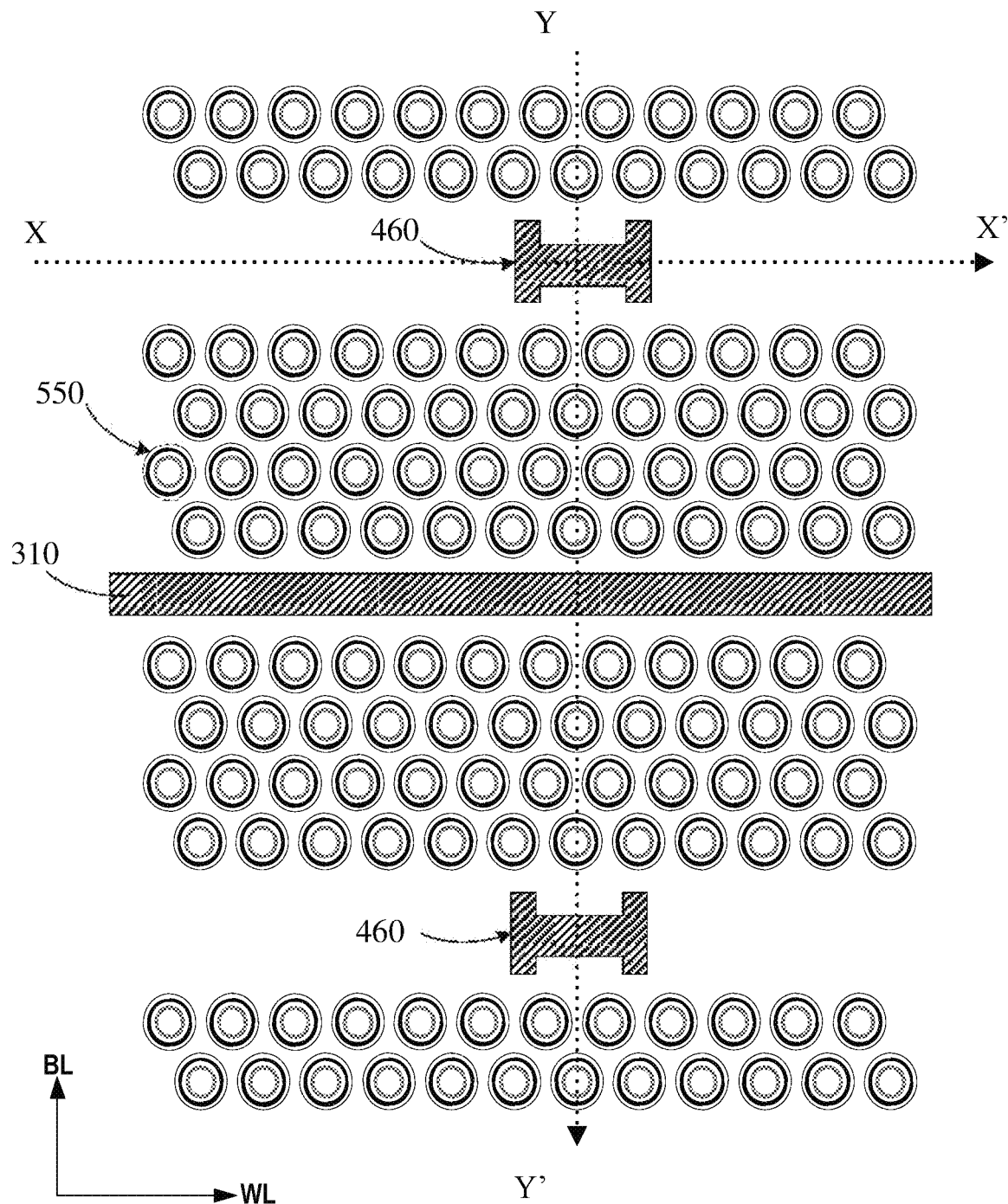
Figure 6B:
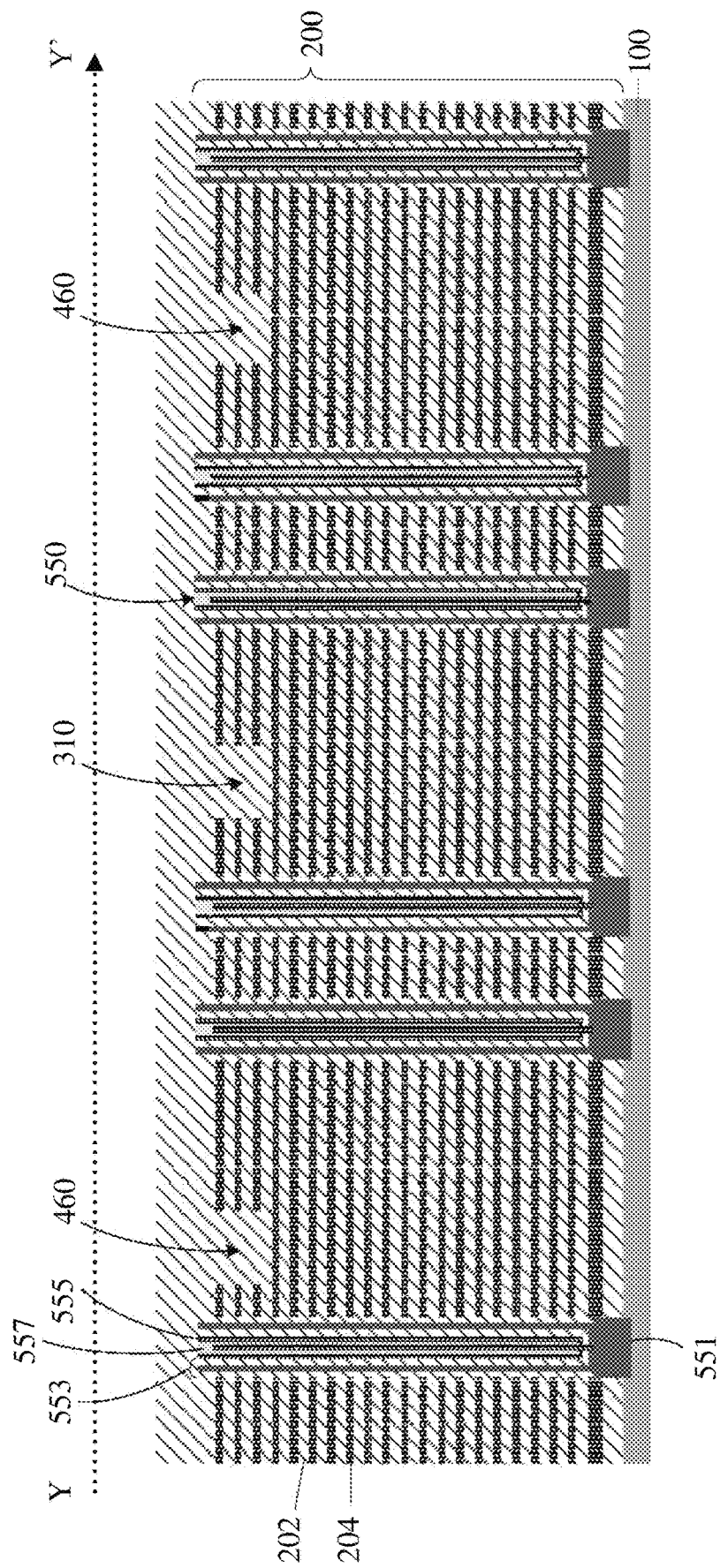

Referring back to FIG. 3, the method proceeds to operation S330, in which multiple channel structures can be formed on both sides of the TSG cut and penetrating the alternating dielectric stack. FIG. 6A illustrates a top view of the 3D structure after operation S330. FIG. 6B illustrates a cross-sectional view along the YY' direction of the 3D structure after operation S330.

In some embodiments, fabricating process for forming the multiple channel structures can include forming multiple channel holes (not shown) penetrating the alternating dielectric stack 200. A process of forming the multiple channel holes can include forming an Hard mask layer (not shown) on the alternating dielectric stack 200, and coating a photoresist layer (not shown) on the hard mask layer. A pattering process can be performed to pattern the hard mask layer. Using the hard mask layer as a mask, an etching process can be followed to etch the alternating dielectric stack 200 to form the multiple channel holes. Each channel hole can completely penetrate the alternating dielectric stack 200 and extend into the substrate 100. The etching process to form the multiple channel holes can be a dry etching, a wet etching, or a combination thereof. After the etching process, the photoresist layer and the hard mask layer can be removed.

In some embodiments, a cleaning process can be performed to clean the multiple channel holes. The cleaning process can be a plasma ashing process including an High temperature ashing, and/or a wet stripping. For example, a plasma source can be used to generate a reactive species, such as oxygen or fluorine. The reactive species can combine with the photoresist remained in the channel holes to form ash, which can be removed with a vacuum pump. Specifically, in some embodiments, monatomic oxygen plasma can be created by exposing oxygen gas at a low pressure to high power radio waves, which ionise the oxygen gas. The residue of the reaction between the oxygen and photoresist material can generate ash in the plasma asher. The byproducts of the ashing process, such as volatile carbon oxides, water vapor can be pumped away with the vacuum pump within the plasma asher.

A channel structure 550 can be formed in each channel hole in a subsequent process. The multiple channel structures 550 can be located on both sides of the TSG cut 310, and be arranged in a staggered array form. As shown in the top view in FIG. 6A, each row of channel structures 550 can be staggered with its neighboring rows of channel structures 550. Further, in some embodiments, there can be four rows of channel structures 550 between the adjacent TSG cut 310 and structure strengthen plugs 460. That is, as shown in FIG. 6A, eight rows of channel structures 550 can be formed between two neighboring TSG cut 310, and eight rows of channel structures 550 can be formed between two neighboring structure strengthen plugs 460 in the BL direction, and four rows of channel holes 500 can be formed on each side of the TSG cut 310. It is noted that, any other suitable arrangement (locations, numbers of rows, etc.) of the multiple channel structures 550 can be designed in some other embodiments.

In some embodiments, as shown in FIG. 6B, each channel structure 550 can include an epitaxial layer 551 on the bottom of the channel hole, a functional layer 553 on the sidewall of the channel hole, a channel layer 555 covering the functional layer 553, and a filling structure 557 enclosed by the channel layer 555. In some embodiments, the functional layer 553 can include a barrier layer, a storage layer, and a tunneling layer.

In some embodiments, fabrication processes to form the channel structures 550 can include forming a epitaxial layer 551 at a bottom of each channel hole. In some embodiments, the epitaxial layer 551 can be a polycrystalline silicon (polysilicon) layer formed by using a selective epitaxial growth (SEG) process. For example, an SEG pre-clean process can be performed to clean the multiple channel holes. A following deposition process can be performed to form a polysilicon layer at the bottom of each channel hole. In some embodiments, any suitable doping process, such as an ion metal plasma (IMP) process, can be performed on the polysilicon layer to form the epitaxial layer 551. In some embodiments, the epitaxial layer 551 may be not directly formed on the surface of the substrate 100. One or more layers can be formed between the epitaxial layer 551 and the substrate 100. That is, the epitaxial layer 551 overlays the substrate 100.

In some embodiments, fabrication processes to form the channel structures 550 can include forming a functional layer 553 on the sidewall of each channel hole. The functional layer 553 can be a composite dielectric layer, such as a combination of a barrier layer, a storage layer, and a tunneling layer. The functional layer 553, including the barrier layer, the storage layer, and the tunneling layer, can be formed by one or more thin film deposition processes, such as ALD, CVD, PVD, any other suitable processes, or any combination thereof.

In some embodiments, the barrier layer can be formed between the storage layer and the sidewall of the channel hole. The barrier layer can be used for blocking the outflow of the electronic charges. In some embodiments, the barrier layer can be a silicon oxide layer or a combination of silicon oxide/silicon nitride/silicon oxide (ONO) layers. In some embodiments, the barrier layer includes high dielectric constant (high k-value) dielectrics (e.g., aluminum oxide). In some embodiments, a thickness of the barrier layer can be in a range from about 3 nm to about 20 nm.

The storage layer can be formed between the tunneling layer and the barrier layer. Electrons or holes from the channel layer can tunnel to the storage layer through the tunneling layer. The storage layer can be used for storing electronic charges (electrons or holes) for memory operation. The storage or removal of charge in the storage layer can impact the on/off state and/or a conductance of the semiconductor channel. The storage layer can include one or more films of materials including, but are not limited to, silicon nitride, silicon oxynitride, a combination of silicon oxide and silicon nitride, or any combination thereof. In some embodiments, the storage layer can include a nitride layer formed by using one or more deposition processes. In some embodiments, a thickness of the storage layer can be in a range from about 3 nm to about 20 nm.

The tunneling layer can be formed on the sidewall of the storage layer. The tunneling layer can be used for tunneling electronic charges (electrons or holes). The tunneling layer can include dielectric materials including, but not limited to, silicon oxide, silicon nitride, silicon oxynitride, or any combination thereof. In some embodiments, the tunneling layer can be an oxide layer formed by using a deposition process. In some embodiments, a thickness of the tunneling layer can be in a range from about 3 nm to about 20 nm.

In some embodiments, fabrication processes to form the channel structures further include forming a channel layer 555 covering the sidewall of the functional layer 553. In some embodiments, the channel layer 555 can be an amorphous silicon layer or a polysilicon layer formed by using a thin film deposition process, such as ALD, CVD, PVD, or any other suitable process. In some embodiments, a thickness of the channel layer 555 can be in a range from about 5 nm to 20 nm.

In some embodiments, fabrication processes to form the channel structures further include forming a filling structure 557 to cover the channel layer 555 and fill the channel hole. In some embodiments, the filling structure 557 can be an oxide layer formed by using any suitable deposition process, such as ALD, CVD, PVD, etc. In some embodiments, the filling structure 557 can include one or more airgaps.

Figure 7A:
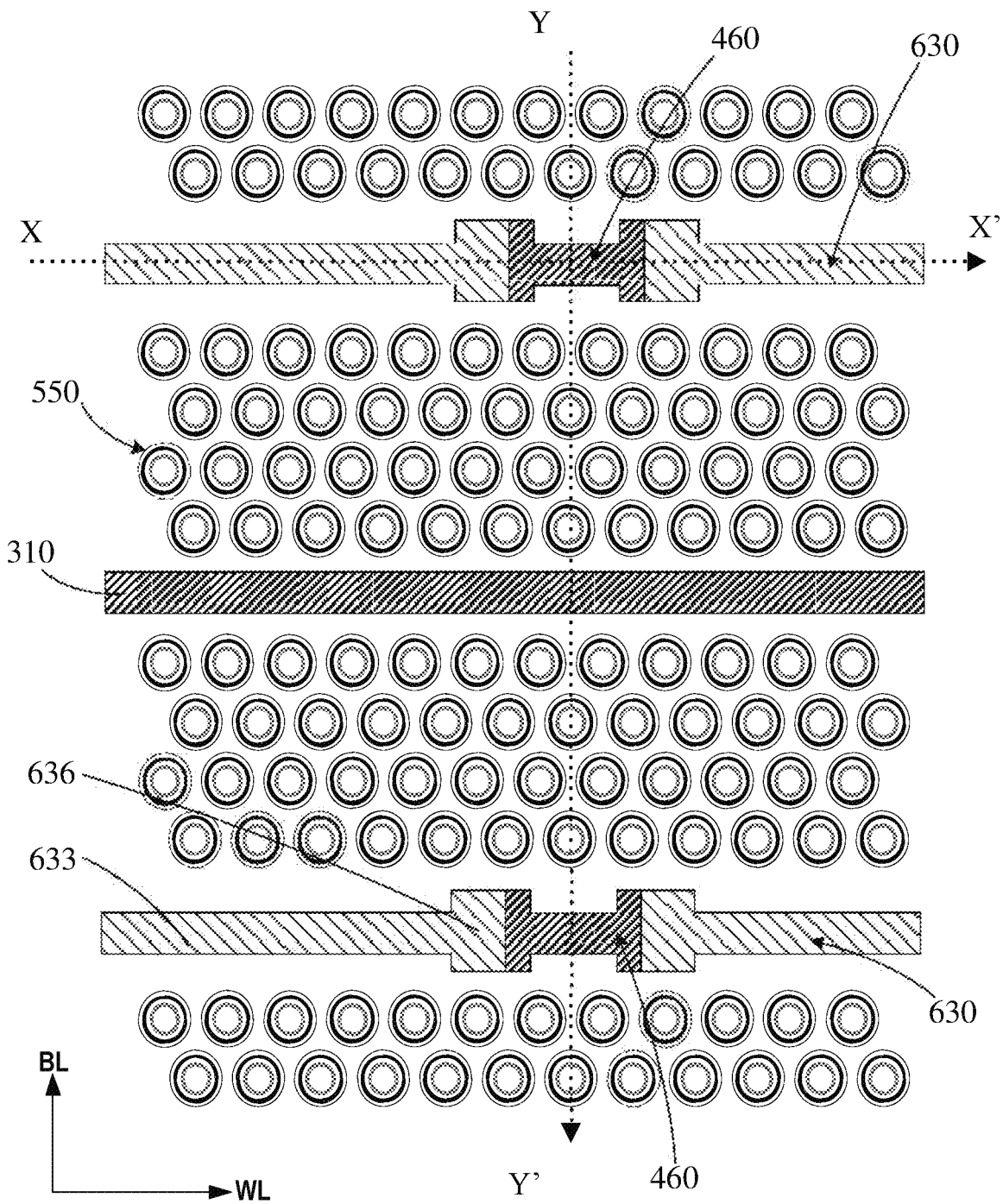
Figure 7B:
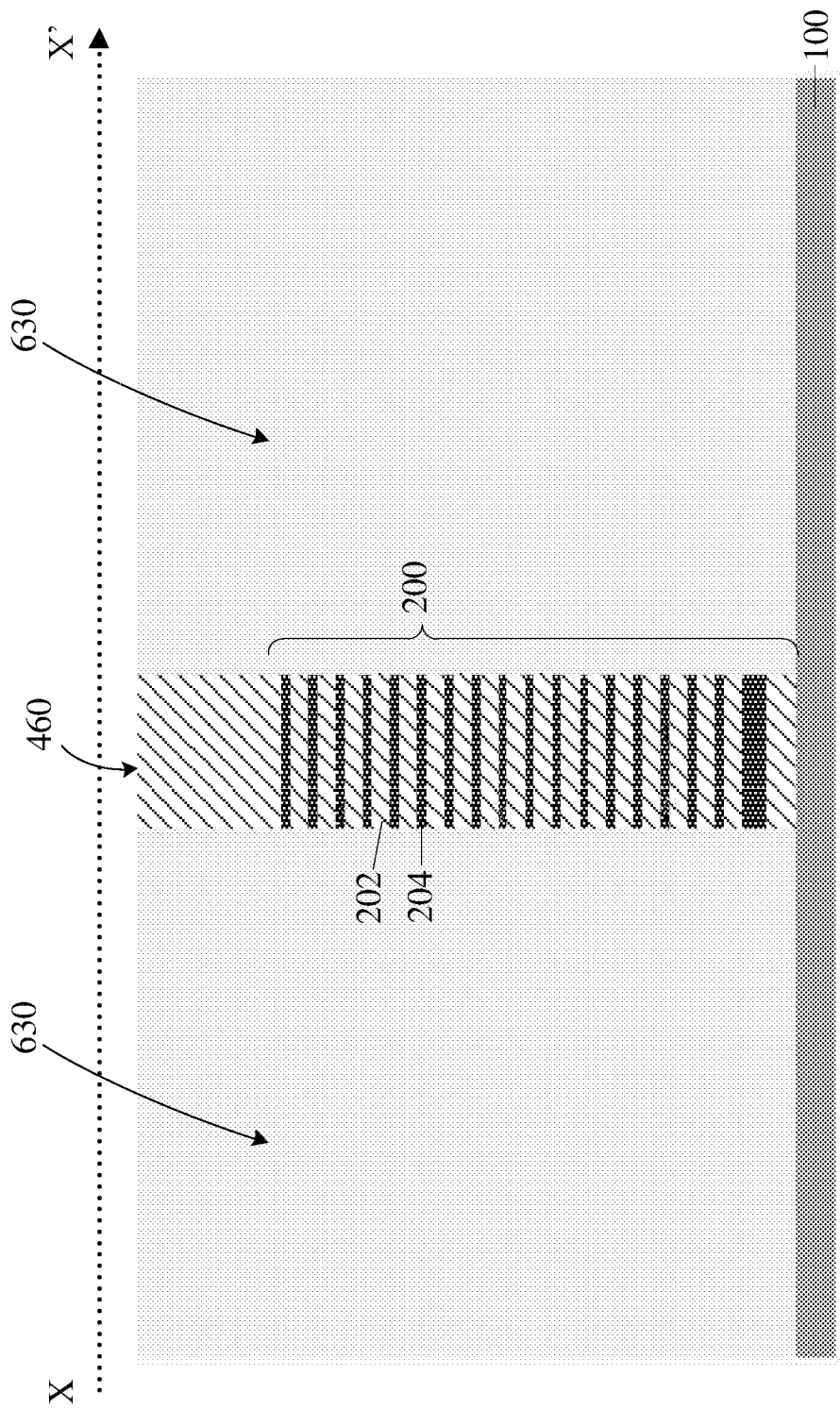

Referring back to FIG. 3, the method proceeds to operation S340, in which multiple gate line slits (GLS) can be formed in the alternating dielectric stack. FIG. 7A illustrates a top view of the 3D structure after operation S340. FIG. 7B illustrates a cross-sectional view along the XX' direction of the 3D structure after operation S340.

As shown in FIG. 7A, the gate line slits (GLS) 630 can extend substantially in a straight line along the WL direction between two arrays of channel structures 550. Each GLS 630 can be located at a same position with a corresponding structure strengthen plug 460 in the BL direction. Each GLS 630 can include can include a narrow body opening 663 having a relatively less width in the BL direction and an enlarged end opening 636 having a relatively larger width in the BL direction. The enlarged end opening 636 can expose the sidewall of the enlarged connecting portions 463 of the structure strengthen plug 460, and the narrow body opening 663 can extend the GLS 630 along the WL direction. As shown in FIG. 7B, the gate line slits (GLS) 630 can vertically penetrate through the alternating dielectric stack 200, and expose the sidewalls of the two enlarged connecting portions 463 of the structure strengthen plug 460.

The multiple GLS 630 can be formed by forming a mask layer over the alternating dielectric stack 200 and patterning the mask using, e.g., photolithography, to form openings corresponding to the multiple GLS 630 in the patterned mask layer. A suitable etching process, e.g., dry etch and/or wet etch, can be performed to remove portions of the alternating dielectric stack 200 exposed by the openings until the multiple GLS 630 expose the substrate 100. The mask layer can be removed after the formation of the multiple GLS 630.

In some embodiments, a doped region (not shown) can be formed at a bottom of each GLS 630 in the substrate 100 by using any suitable doping process, such as ion implantation and/or thermal diffusion through the GLS 630. The dopant in the doped region can be any suitable N+ or P+ ions. After forming a conductive wall in the GLS 630 in a subsequent process, the lower end of each conductive wall can be in contact with a corresponding doped region.

Figure 8A:
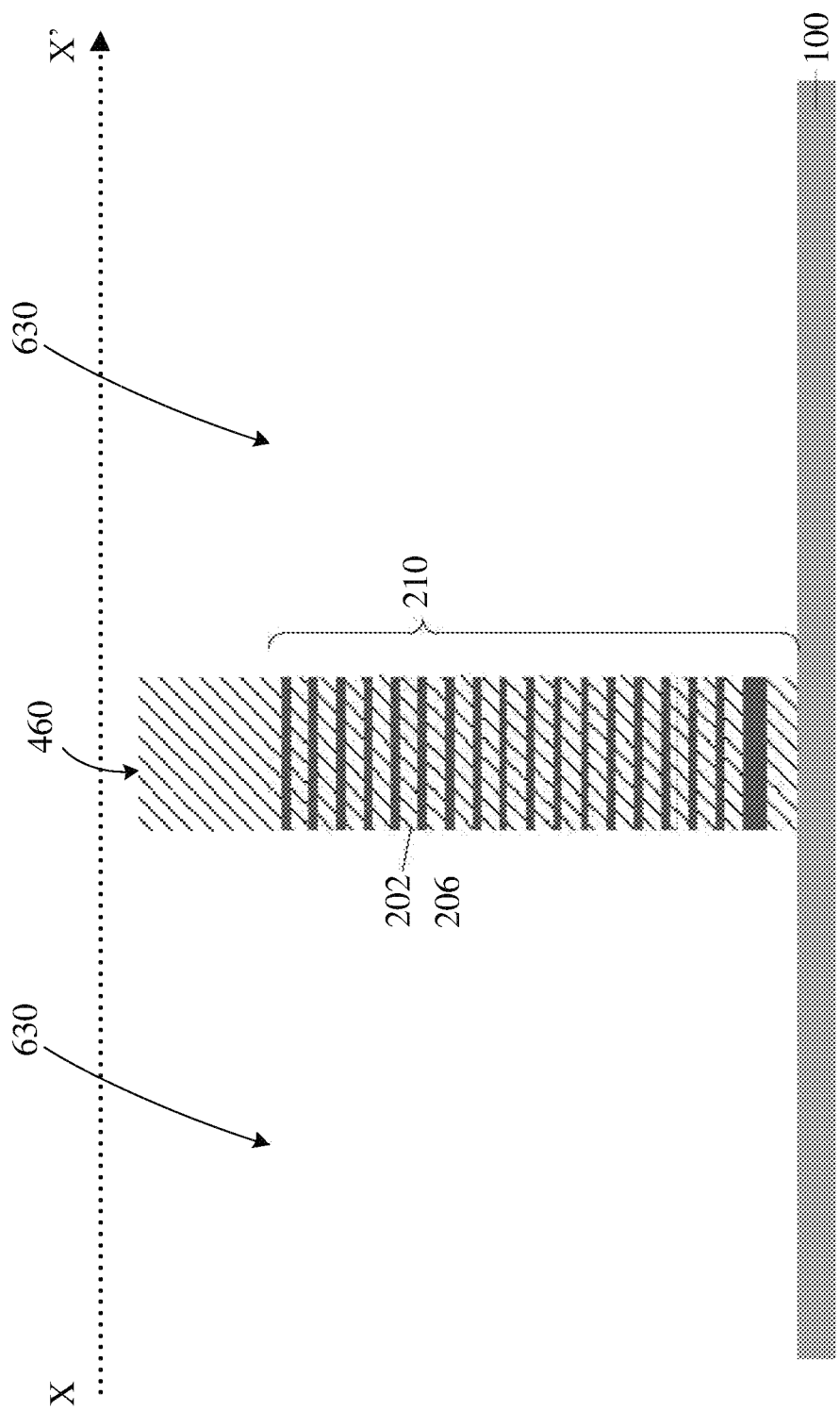
Figure 8B:
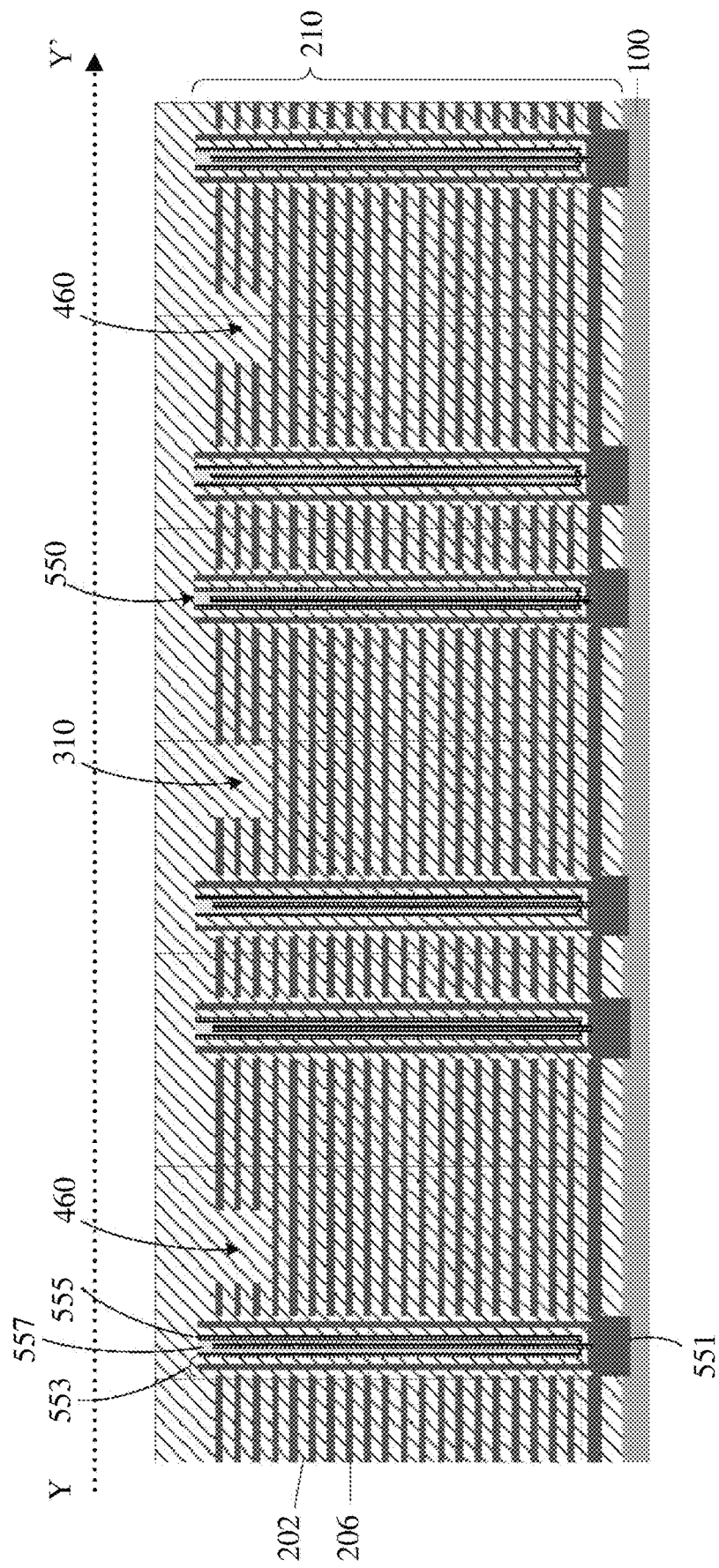

Referring back to FIG. 3, the method proceeds to operation S350, in which the alternating dielectric stack can be transformed into an alternating conductive/dielectric stack including multiple conductive/dielectric layer pairs. In some embodiments, a gate replacement process (also known as the "word line replacement" process) can be performed to replace second dielectric layers 204 (e.g., silicon nitride) of the alternating dielectric stack 200 with conductive layers 206. FIG. 8A illustrates a cross-sectional view along the XX' direction of the 3D structure after operation S350. FIG. 8B illustrates a cross-sectional view along the YY' direction of the 3D structure after operation S350.

In some embodiments, after forming the multiple GLS 630, the second dielectric layers 204 in the alternating dielectric stack 200 can be removed through the GLS 630 to form multiple lateral trenches. The multiple lateral trenches can extend in a lateral direction, and can be used as spaces for conductive layers 206 to be formed in a subsequent process. It is noted that, the term "lateral/laterally" used herein means the a plane parallel to the surface of the substrate 100. The second dielectric layers 204 in the alternating dielectric stack 200 are used as sacrificial layers, and are removed by used any suitable etching process, e.g., an isotropic dry etch or a wet etch. The etching process can have sufficiently high etching selectivity of the material of the second dielectric layers 204 over the materials of the first dielectric layer 202, such that the etching process can have minimal impact on the first dielectric layer 202. The isotropic dry etch and/or the wet etch and a following cleaning process can remove second dielectric layers 204 in various directions to expose the top and bottom surfaces of each first dielectric layer 202. As such, multiple lateral trenches can then be formed between first dielectric layers 202.

As shown in FIG. 8A and 8B, multiple conductive layers 206 can be formed in the multiple lateral trenches. The multiple conductive layers 206 can be used as word lines (i.e., gate electrodes) in the 3D memory device. In some embodiments, each conductive layers 206 can be coated with one or more insulating layers (not shown) used as gate dielectric layers for insulating the respective word line (i.e., gate electrode).

In some embodiments, one or more insulating layers (not shown) can be formed in each of the multiple lateral trenches to cover the exposed surfaces of the lateral trenches with one or more suitable insulating materials. For example, one or more suitable deposition processes, such as CVD, PVD, and/or ALD, can be utilized to deposit the one or more insulating materials into the lateral trenches. In some embodiments, a recess etch and/or a chemical-mechanical planarization (CMP) can be used to remove excessive insulating material(s). The one or more insulating materials can include any suitable materials (e.g., high k-value dielectrics) that provide electric insulating function. For example, the one or more insulating materials can include silicon oxide, silicon nitride, silicon oxynitride, aluminum oxide, titanium nitride, etc., and/or any suitable combinations thereof. In some embodiments, multiple insulating layers can have different insulating materials.

A conductive layer 206 can be formed in each lateral trench between the one or more insulating layers. The conductive layer 206 can be formed by filling the lateral trenches with a suitable gate electrode metal material. The conductive layer 206 can provide the base material for the subsequently-formed word lines (i.e., gate electrodes). The gate electrode metal material can include any suitable conductive material, e.g., tungsten, aluminum, copper, cobalt, or any combination thereof, for forming the word lines (i.e., gate electrodes). The gate electrode material can be deposited into lateral trenches using a suitable deposition method such as CVD, physical vapor deposition (PVD), plasma-enhanced CVD (PECVD), sputtering, metal-organic chemical vapor deposition (MOCVD), and/or ALD. In some embodiments, the conductive layers 206 include tungsten formed by CVD. As such, the alternating dielectric stack 200 is transformed into an alternating conductive/dielectric stack 210.

Figure 9A:
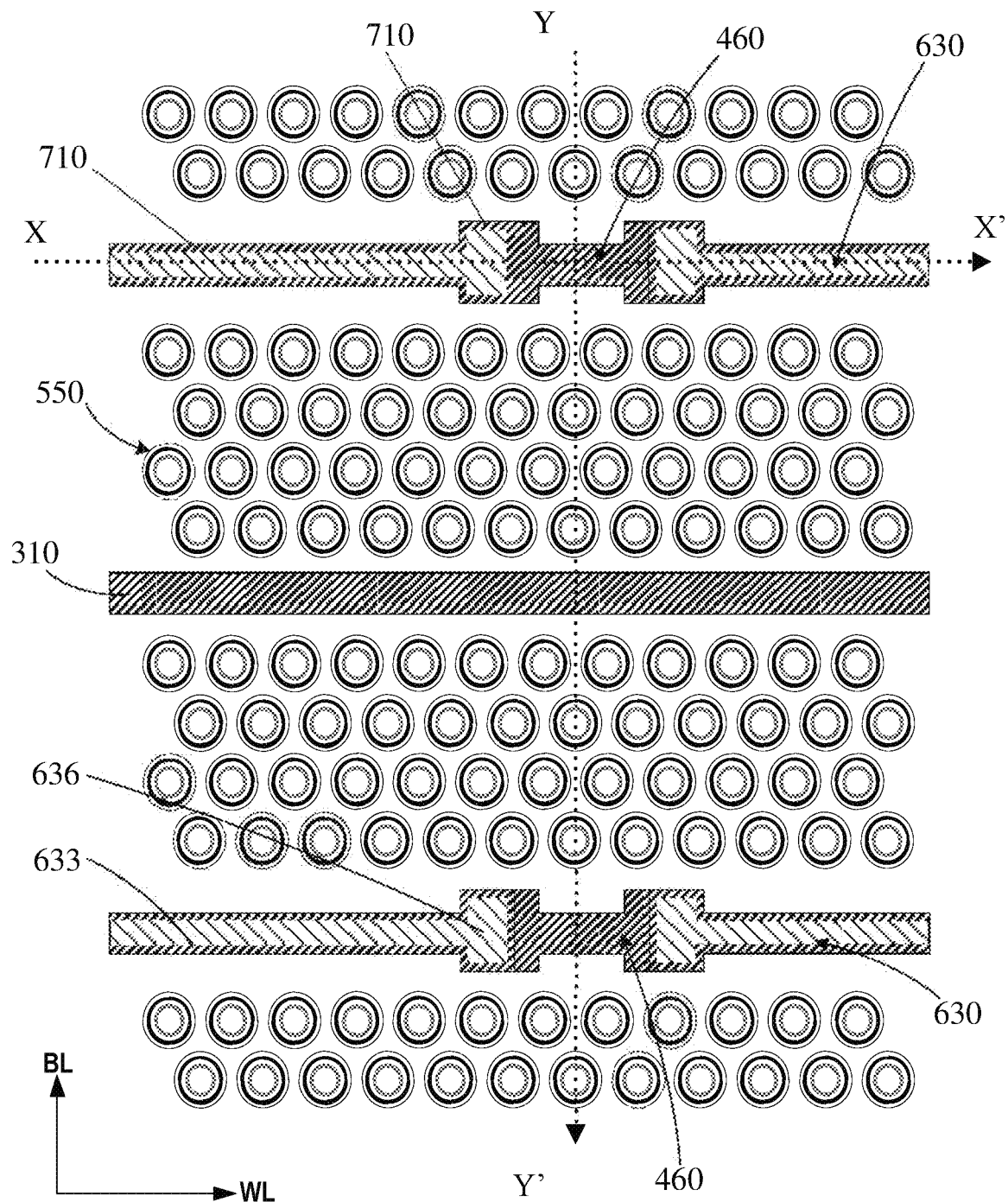
Figure 9B:
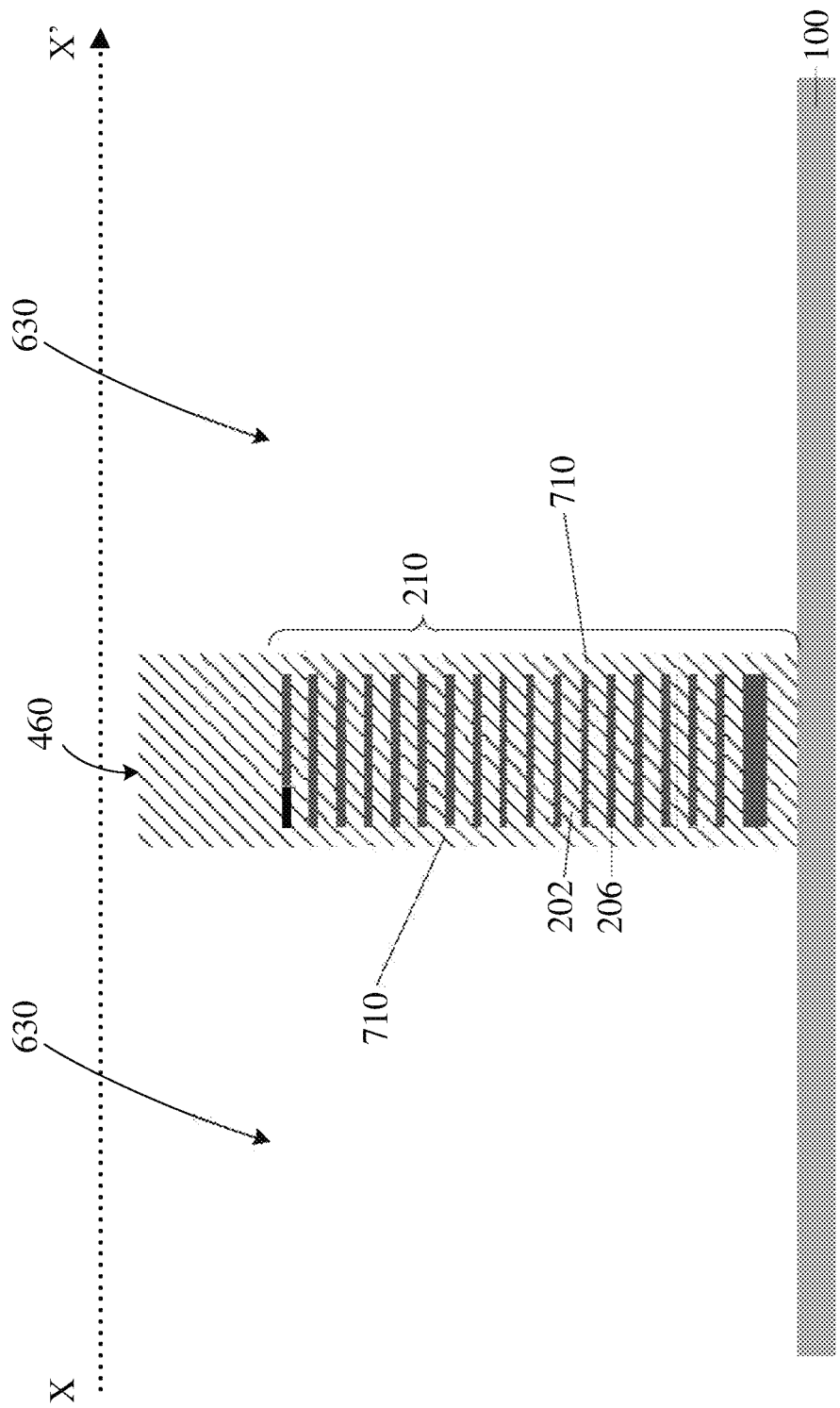

Referring back to FIG. 3, the method proceeds to operation S360, in which a spacer layer can be formed on the sidewalls of the multiple GLS 630. The spacer layer is also referred as a gate line spacer (GLSP) layer, and can be used to provide electrical insulation between the multiple conductive layers 206 and a conductive wall formed in a subsequent process. FIG. 9A illustrates a top view of the 3D structure after operation S360. FIG. 9B illustrates a cross-sectional view along the XX' direction of the 3D structure after operation S360.

In some embodiments, the fabricating process for forming spacer layer 710 can include a word line gate recess process. After forming the multiple conductive layers 206, portions of the multiple conductive layers 206 (word lines) exposed by the GLS 630 can be removed by a recess etching process. In some embodiments, in order to ensure the insulation between multiple conductive layers 206 (word lines), a recess etching process, such as a wet etching process, can be performed to remove portions of the multiple conductive layers 206 exposed by the GLS 630. In doing so, a recess can be formed in each lateral trench adjacent to the GLS 630.

In some embodiments, the spacer layer 710 can have a laminated structure (not shown) including two or more spacer sublayers formed by using any suitable deposition processes, such as atomic layer deposition (ALD) processes. For example, the spacer layer 710 can include a first spacer sublayer (not shown) covering the sidewall of the GLS 630 and the exposed surfaces of the multiple gate structures 500. The first spacer sublayer can include a low temperature oxide material, such as silicon oxide, configured to prevent the multiple conductive layers 206 from being oxidized in the subsequent processes. The spacer layer 710 can further include a second spacer sublayer (not shown) to cover the first spacer sublayer 710. The second spacer sublayer can include an High k-value material, such as silicon nitride.

Such laminated structure can efficiently increase the equivalent oxide thickness (EOT) of the spacer layer 710, thereby improving the isolation performance of the spacer layer 710.

In some embodiments, after forming the spacer layer 710, an etching process can be performed to shaping the spacer layer 710. For example, as shown in FIG. 9B, portions of the spacer layer 710 at the bottom of each GLS 630 can be removed to expose the substrate 100. Further, portions of the spacer layer 710 that are outside the multiple GLS 630 can be removed in the same etching process.

Figure 10A:
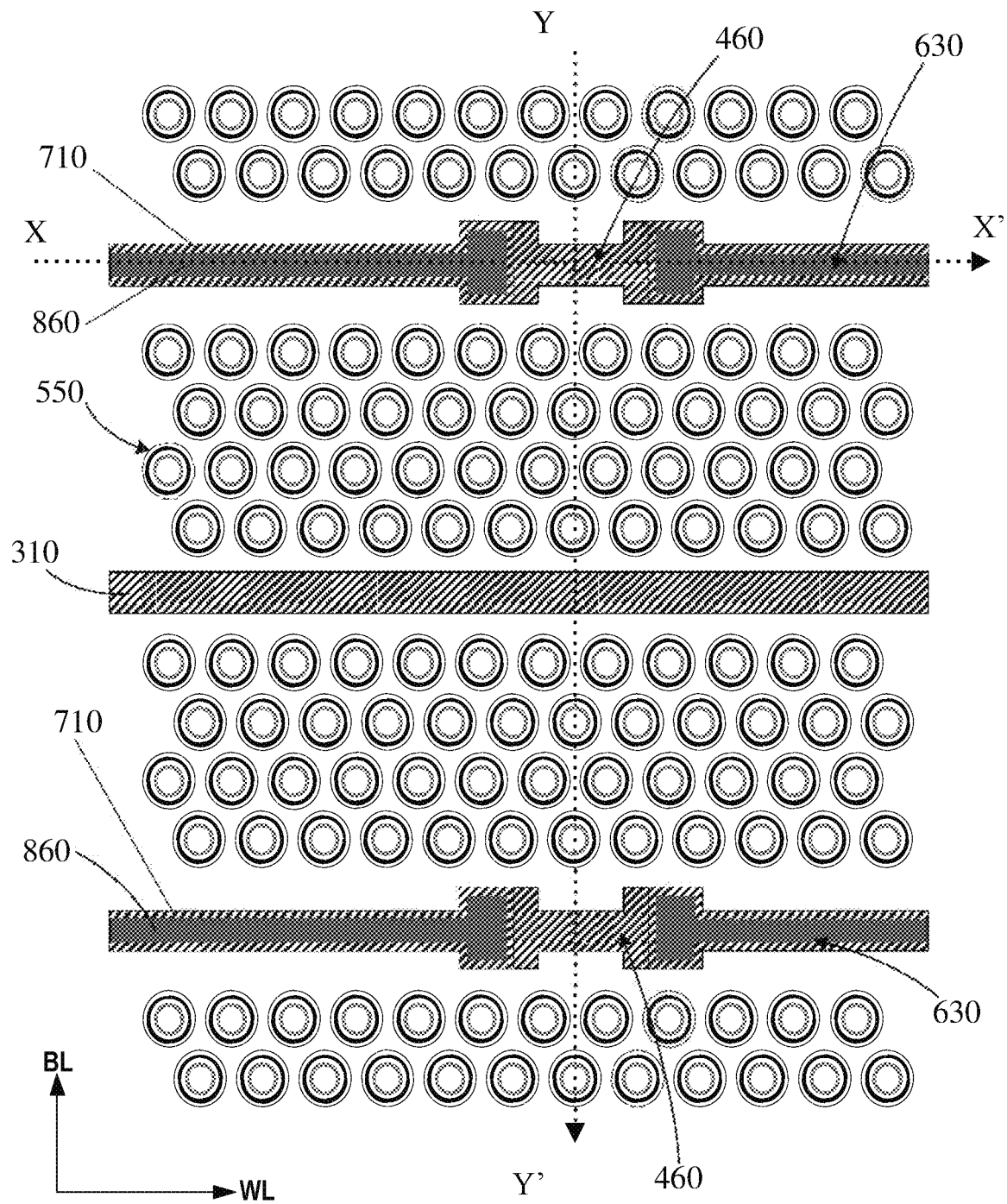
Figure 10B:
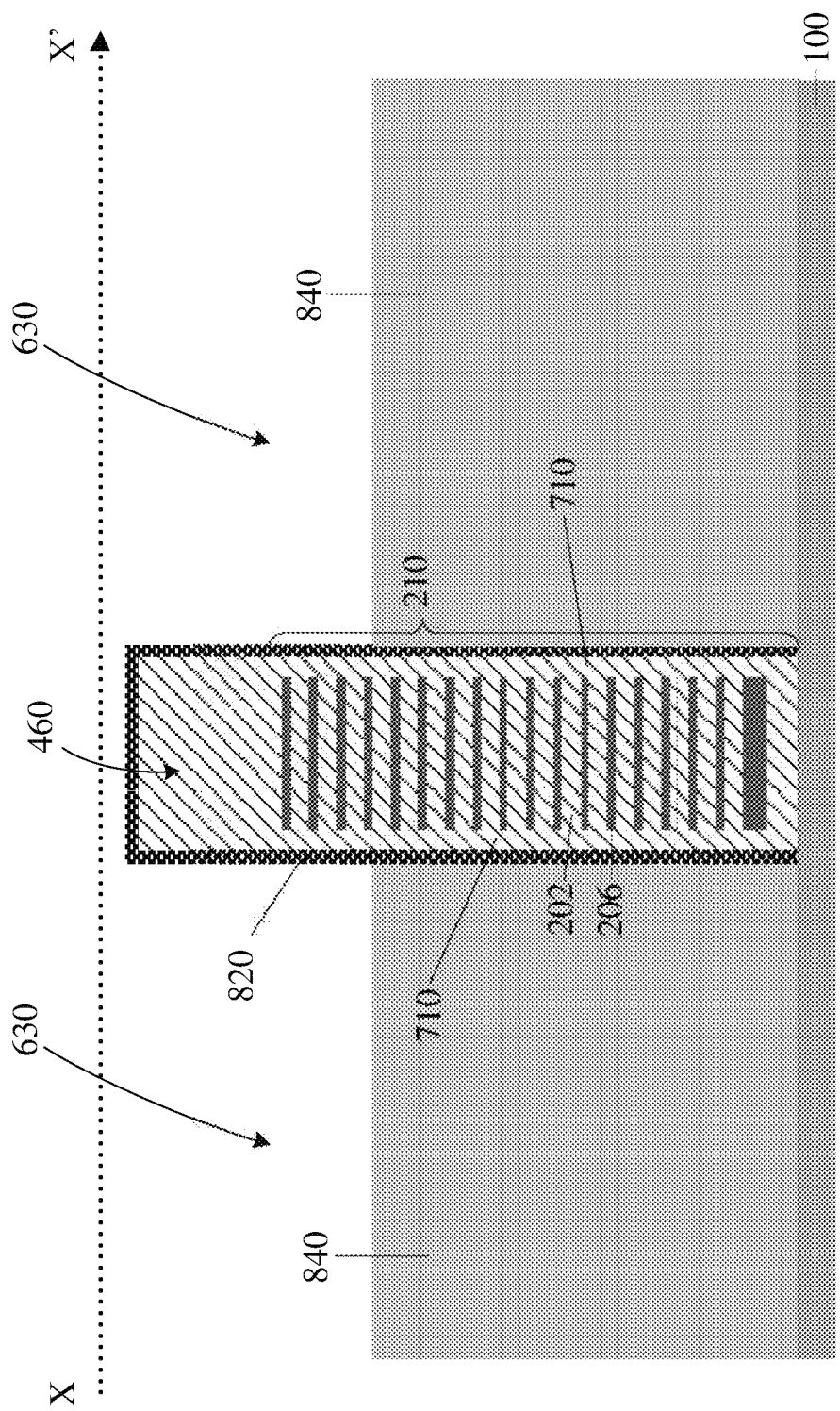
Figure 10C:
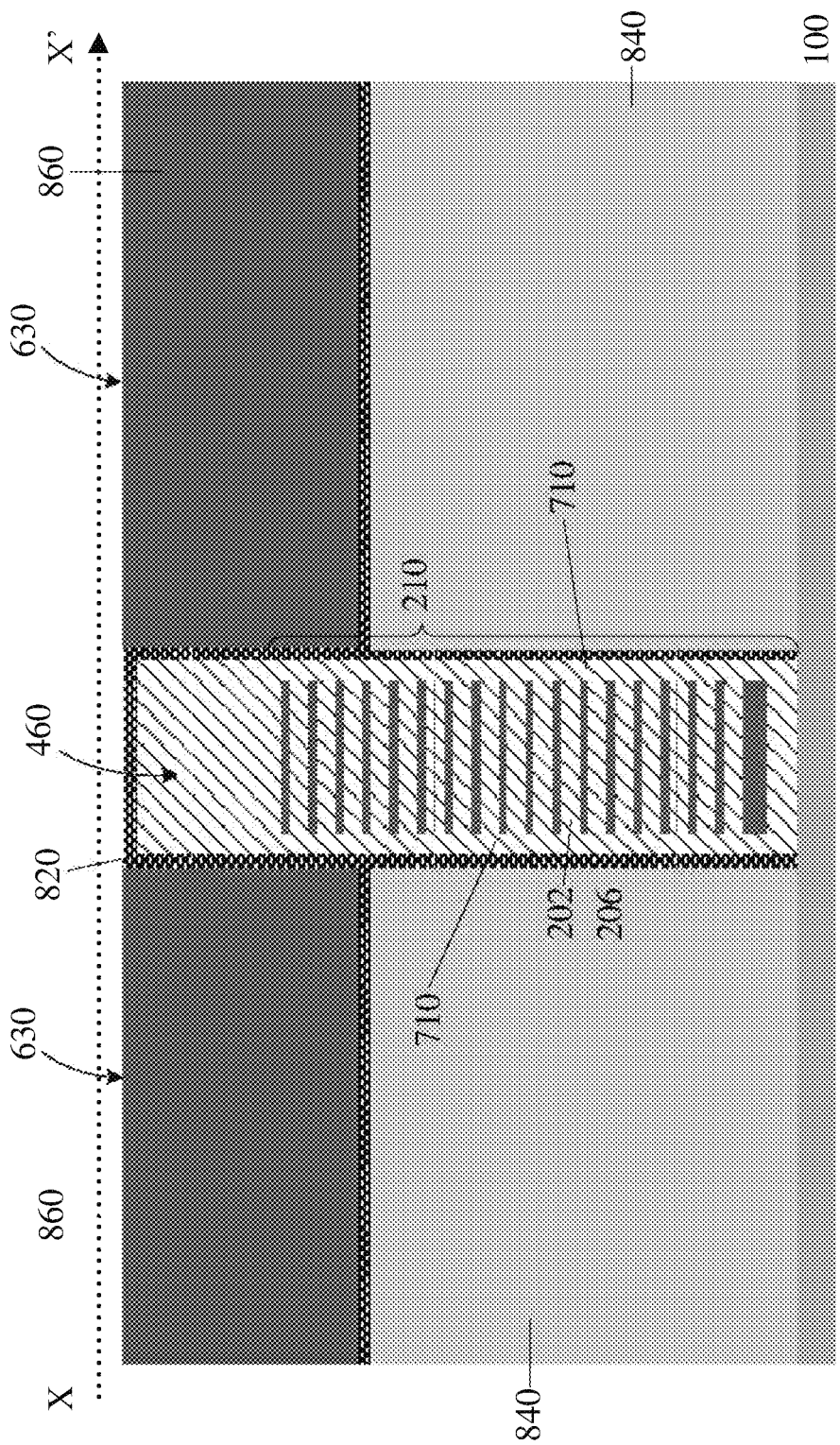

Referring back to FIG. 3, the method proceeds to operation S370, in which a conductive wall can be formed in each of the multiple GLS. The conductive wall can be in contact with the doped region (not shown) in the substrate 100, and is used as an array common source (ACS) of the multiple NAND strings. In some embodiments, the conductive wall can include a gate line slit glue layer, a lower conductive wall, and an upper conductive wall. FIG. 10A illustrates a top view of the 3D structure after operation S370. FIG. 10B illustrates a cross-sectional view along the XX' direction of the 3D structure at certain stage of operation S370. FIG. 10C illustrates a cross-sectional view along the XX' direction of the 3D structure after operation S370.

As shown in FIG. 10B, in some embodiments, fabricating process for forming the conductive wall can include forming a gate line slit glue layer 820 covering the sidewalls of the GLS 630. The gate line slit glue layer 820 can be formed by performing an implantation (IMP) process to treat the exposed surface of the spacer layer 710. The IMP process can implant titanium ions and/or titanium nitride ions to the exposed surface of the spacer layer 710 to form the gate line slit glue layer 820.

Still as shown in FIG. 10B, in some embodiments, fabricating process for forming the conductive wall can include forming a lower conductive wall 840 in a lower portion of the multiple GLS 630. The lower conductive wall 840 can be formed by depositing a first conductive material having a low stress to the 3D structure, such as polysilicon, silicides, etc. The first conductive material can be deposited into the multiple GLS 630 using a suitable deposition method such as CVD, physical vapor deposition (PVD), plasma-enhanced CVD (PECVD), sputtering, metal-organic chemical vapor deposition (MOCVD), and/or ALD. A following etching back process can be performed to adjust the top surface of the lower conductive wall 840.

As shown in FIG. 10C, another gate line slit glue layer 820 can be formed to cover the top surface of the lower conductive wall 840. The gate line slit glue layer 820 can be formed by performing an implantation (IMP) process to treat the top surface of the lower conductive wall 840. The IMP process can implant titanium ions and/or titanium nitride ions to the top surface of the lower conductive wall 840 to form the gate line slit glue layer 820.

Still as shown in FIG. 10C, in some embodiments, fabricating process for forming the conductive wall can include forming an upper conductive wall 860 in an upper portion of the multiple GLS 630. In some embodiments, a thickness of the upper conductive wall 860 is less than five conductive/dielectric pairs of the alternating conductive/dielectric stack 210. The upper conductive wall 860 can be formed by depositing a second conductive material having an High stress to the 3D structure, such as metal materials including tungsten, aluminum, copper, and/or combinations thereof, etc. The second conductive material can be deposited into the multiple GLS 630 using a suitable deposition method such as CVD, PVD, PECVD, sputtering, metal-organic chemical MOCVD, and/or ALD. A following a chemical-mechanical planarization (CMP) process can be performed to planarize the top surface of the formed 3D.

Accordingly, a 3D memory device as shown in FIGS. 10A and 10C, and a fabricating method as shown in FIG. 3 are disclosed. By forming an H-like-shape structure strengthen plug including a narrow support body and two enlarged connecting portions that are connected with the two enlarged end portions of the GLS structure, the thickness of the silicon oxide layer between the conductive wall in the GLS structure and the word lines, and the area of the structure strengthen plug 60 is limited in the same time. Therefore, the risk of electrical leakage between the conductive wall in the GLS structure and the word lines is decreased, while the amount of silicon oxide in the ALD deposition to form the structure strengthen plug is also decreased to effectively reduce the cost.

One aspect of the present disclosure provides a method for forming a three-dimensional (3D) memory device. The method can comprise: forming an alternating dielectric stack on a substrate; forming a top selective gate cut and two structure strengthen plugs in an upper portion of the alternating dielectric stack, wherein each structure strengthen plug has a narrow support body and two enlarged connecting portions; forming a plurality of channel structures in the alternating dielectric stack; forming a plurality of gate line silts in the alternating dielectric stack, wherein each gate line slit exposes a sidewall of one enlarged connecting portion of a corresponding structure strengthen plug; transforming the alternating dielectric stack into an alternating conductive/dielectric stack; and forming a gate line slit structure in each gate line slit including an enlarged end portion connected to one enlarged connecting portion of a corresponding structure strengthen plug.

In some embodiments, forming the alternating dielectric stack comprises: forming at least 32 dielectric layer pairs stacked in a vertical direction, wherein each dielectric layer pair includes a first dielectric layer and a second dielectric layer that is different from the first dielectric layer.

In some embodiments, the top selective gate cut and the structure strengthen plug are simultaneously formed in a single process.

In some embodiments, forming the top selective gate cut and the two structure strengthen plugs comprises: forming a trench in an upper portion of the alternating dielectric stack and extending along a word line direction, and forming two openings on both side of the trench; and depositing an insulating material in the trench and the two openings to form the top selective gate cut and the two structure strengthen plugs respectively.

In some embodiments, forming the trench and the two openings comprises: etching top three dielectric layer pairs of the alternating dielectric stack to form the trench and the two openings; wherein the two openings have a same distance from the trench along a bit line direction.

In some embodiments, forming the opening comprises: using an H-like-shape patterned mask to form the opening having a less width in the bit line direction in the middle and a larger width in the bit line direction at two ends along the word line direction.

In some embodiments, forming the plurality of channel structures comprises:

forming a plurality of channel holes penetrating the alternating dielectric layer; forming a functional layer on sidewalls of the plurality of channel holes; forming a channel layer covering the functional layer in each channel hole; and forming a dielectric filling structure filling each channel hole.

In some embodiments, forming the plurality of channel holes comprises: forming a same number of rows of channel holes between adjacent top selective gate cut and structure strengthen plug.

In some embodiments, forming the plurality of channel holes comprises: forming an even number of rows of channel holes between adjacent top selective gate cut and structure strengthen plug; wherein each row of channel holes are arranged staggered with adjacent row of channel holes.

In some embodiments, forming the plurality of gate line silts comprises: forming a pair of gate line slits on both sides of each structure strengthen plug, penetrating the alternating dielectric stack, and extending along the word line direction.

In some embodiments, transforming the alternating dielectric stack into the alternating conductive/dielectric stack comprises: replacing the second dielectric layers in the alternating dielectric with conductive layers.

The method of claim 1, wherein forming the gate line slit structure in each gate line slit comprises: forming a gate line slit glue layer on sidewalls of each gate line slit; forming a lower conductive wall in a lower portion of each gate line slit; forming an upper conductive wall in an upper portion of each gate line slit.

In some embodiments, forming the gate line slit structure in each gate line slit further comprises: forming another gate line slit glue layer between the lower conductive wall and the upper conductive wall; wherein the lower conductive wall has a less stress to the 3D memory device compared to the upper conductive wall.

Another aspect of the present disclosure provides a three-dimensional (3D) memory device, comprising: an alternating conductive/dielectric stack on a substrate; a plurality of channel structures in the alternating conductive/dielectric stack; a top selective gate cut between the plurality of channel structures and extending in a word line direction; two structure strengthen plugs between the plurality of channel structures, each having a narrow support body and two enlarged connecting portions; a plurality of gate line slit structures in the alternating conductive/dielectric stack, wherein each gate line slit structure includes an enlarged end portion connected to one enlarged connecting portion of a corresponding structure strengthen plug.

In some embodiments, the alternating conductive/dielectric stack comprises at least 32 conductive/dielectric layer pairs stacked in a vertical direction.

In some embodiments, the top selective gate cut and the two structure strengthen plugs comprise a same material and are located in a same upper portion of the alternating conductive/dielectric stack; and the two structure strengthen plugs have a same distance from the top selective gate cut along a bit line direction.

In some embodiments, each structure strengthen plug has a narrow support body with a less width in the bit line direction and two enlarged connecting portions with a larger width in the bit line direction arranged at two ends in the word line direction.

In some embodiments, each channel structures comprises: a functional layer on a sidewall of a channel hole; a dielectric filling structure filling each channel hole; and a channel layer between the functional layer and the dielectric filling.

In some embodiments, a same even number of rows of channel structures are arranged between adjacent top selective gate cut and structure strengthen plug; and each row of channel structures are arranged staggered with adjacent row of channel structures.

In some embodiments, each gate line slit structure penetrates the alternating conductive/dielectric stack, and extends along the word line direction, and comprises a lower conductive wall, an upper conductive wall, and a gate line slit glue layer between the lower conductive wall and the upper conductive wall.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming an alternating dielectric stack on a substrate;
    forming a top selective gate cut and two structure strengthen plugs in an upper portion of the alternating dielectric stack, wherein each structure strengthen plug has a narrow support body and two enlarged connecting portions;
    forming a plurality of channel structures in the alternating dielectric stack;
    forming a plurality of gate line silts in the alternating dielectric stack, wherein each gate line slit exposes a sidewall of one enlarged connecting portion of a corresponding structure strengthen plug;
    transforming the alternating dielectric stack into an alternating conductive/dielectric stack; and
    forming a gate line slit structure in each gate line slit including an enlarged end portion connected to one enlarged connecting portion of a corresponding structure strengthen plug.

2. The method of claim 1, wherein forming the alternating dielectric stack comprises:
    forming at least 32 dielectric layer pairs stacked in a vertical direction, wherein each dielectric layer pair includes a first dielectric layer and a second dielectric layer that is different from the first dielectric layer.

3. The method of claim 1, wherein the top selective gate cut and the structure strengthen plug are simultaneously formed in a single process.

4. The method of claim 3, wherein forming the top selective gate cut and the two structure strengthen plugs comprises:
forming a trench in an upper portion of the alternating dielectric stack and extending along a word line direction, and forming two openings on both side of the trench; and
depositing an insulating material in the trench and the two openings to form the top selective gate cut and the two structure strengthen plugs respectively.

5. The method of claim 4, wherein forming the trench and the two openings comprises:
etching top three dielectric layer pairs of the alternating dielectric stack to form the trench and the two openings;
wherein the two openings have a same distance from the trench along a bit line direction.

6. The method of claim 4, wherein forming the opening comprises:
using an H-like-shape patterned mask to form the opening having a less width in the bit line direction in the middle and a larger width in the bit line direction at two ends along the word line direction.

7. The method of claim 1, wherein forming the plurality of channel structures comprises:
forming a plurality of channel holes penetrating the alternating dielectric layer;
forming a functional layer on sidewalls of the plurality of channel holes;
forming a channel layer covering the functional layer in each channel hole; and
forming a dielectric filling structure filling each channel hole.

8. The method of claim 7, wherein forming the plurality of channel holes comprises:
forming a same number of rows of channel holes between adjacent top selective gate cut and structure strengthen plug.

9. The method of claim 8, wherein forming the plurality of channel holes comprises:
forming an even number of rows of channel holes between adjacent top selective gate cut and structure strengthen plug;
wherein each row of channel holes are arranged staggered with adjacent row of channel holes.

10. The method of claim 1, wherein forming the plurality of gate line silts comprises:
forming a pair of gate line slits on both sides of each structure strengthen plug, penetrating the alternating dielectric stack, and extending along the word line direction.

11. The method of claim 2, wherein transforming the alternating dielectric stack into the alternating conductive/dielectric stack comprises:
replacing the second dielectric layers in the alternating dielectric with conductive layers.

12. The method of claim 1, wherein forming the gate line slit structure in each gate line slit comprises:
forming a gate line slit glue layer on sidewalls of each gate line slit;
forming a lower conductive wall in a lower portion of each gate line slit;
forming an upper conductive wall in an upper portion of each gate line slit.

13. The method of claim 12, wherein forming the gate line slit structure in each gate line slit further comprises:
forming another gate line slit glue layer between the lower conductive wall and the upper conductive wall;
wherein the lower conductive wall has a less stress to the 3D memory device compared to the upper conductive wall.

14. A three-dimensional (3D) memory device, comprising:
an alternating conductive/dielectric stack on a substrate;
a plurality of channel structures in the alternating conductive/dielectric stack;
a top selective gate cut between the plurality of channel structures and extending in a word line direction;
two structure strengthen plugs between the plurality of channel structures, each having a narrow support body and two enlarged connecting portions;
a plurality of gate line slit structures in the alternating conductive/dielectric stack, wherein each gate line slit structure includes an enlarged end portion connected to one enlarged connecting portion of a corresponding structure strengthen plug.

15. The 3D memory device of claim 14, wherein the alternating conductive/dielectric stack comprises:
at least 32 conductive/dielectric layer pairs stacked in a vertical direction.

16. The 3D memory device of claim 14, wherein:
the top selective gate cut and the two structure strengthen plugs comprise a same material and are located in a same upper portion of the alternating conductive/dielectric stack; and
the two structure strengthen plugs have a same distance from the top selective gate cut along a bit line direction.

17. The 3D memory device of claim 14, wherein:
each structure strengthen plug has a narrow support body with a less width in the bit line direction and two enlarged connecting portions with a larger width in the bit line direction arranged at two ends in the word line direction.

18. The 3D memory device of claim 14, wherein each channel structures comprises:
a functional layer on a sidewall of a channel hole;
a dielectric filling structure filling each channel hole; and
a channel layer between the functional layer and the dielectric filling.

19. The 3D memory device of claim 14, wherein:
a same even number of rows of channel structures are arranged between adjacent top selective gate cut and structure strengthen plug; and
each row of channel structures are arranged staggered with adjacent row of channel structures.

20. The 3D memory device of claim 14, wherein:
each gate line slit structure penetrates the alternating conductive/dielectric stack, and extends along the word line direction, and comprises a lower conductive wall, an upper conductive wall, and a gate line slit glue layer between the lower conductive wall and the upper conductive wall.

* * * * *